United States Patent
Itayama

(10) Patent No.: US 11,673,392 B2
(45) Date of Patent: Jun. 13, 2023

(54) PIEZOELECTRIC DEVICE, LIQUID EJECTING HEAD, LIQUID EJECTING APPARATUS, AND METHOD FOR PRODUCING PIEZOELECTRIC DEVICE

(71) Applicant: Seiko Epson Corporation, Tokyo (JP)

(72) Inventor: Yasuhiro Itayama, Kai (JP)

(73) Assignee: SEIKO EPSON CORPORATION

( * ) Notice: Subject to any disclaimer, the term of this patent is extended or adjusted under 35 U.S.C. 154(b) by 0 days.

(21) Appl. No.: 17/389,595

(22) Filed: Jul. 30, 2021

(65) Prior Publication Data
US 2022/0032624 A1 Feb. 3, 2022

(30) Foreign Application Priority Data
Jul. 31, 2020 (JP) .............................. JP2020-130137

(51) Int. Cl.
*B41J 2/16* (2006.01)
*H01L 41/047* (2006.01)
*B41J 2/14* (2006.01)

(52) U.S. Cl.
CPC ......... *B41J 2/1612* (2013.01); *B41J 2/14274* (2013.01); *H01L 41/0475* (2013.01); *H01L 41/0478* (2013.01)

(58) Field of Classification Search
None
See application file for complete search history.

(56) References Cited

U.S. PATENT DOCUMENTS

| | | | |
|---|---|---|---|
| 7,997,695 B2 | 8/2011 | Shimada | |
| 2012/0295100 A1* | 11/2012 | Watanabe | H01L 21/02282 427/58 |
| 2014/0368583 A1* | 12/2014 | Morozumi | B41J 2/14233 310/365 |

FOREIGN PATENT DOCUMENTS

JP 2009-234022 A 10/2009

* cited by examiner

*Primary Examiner* — Erica S Lin
(74) *Attorney, Agent, or Firm* — Harness, Dickey & Pierce, P.L.C.

(57) ABSTRACT

A piezoelectric device includes a diaphragm, a piezoelectric actuator, and an orientation layer between the diaphragm and the piezoelectric layer. The piezoelectric actuator has a first electrode, a piezoelectric layer, and a second electrode, with the first electrode, a piezoelectric layer, and a second electrode on the diaphragm. The orientation layer is a stack of two or more tiers.

18 Claims, 14 Drawing Sheets

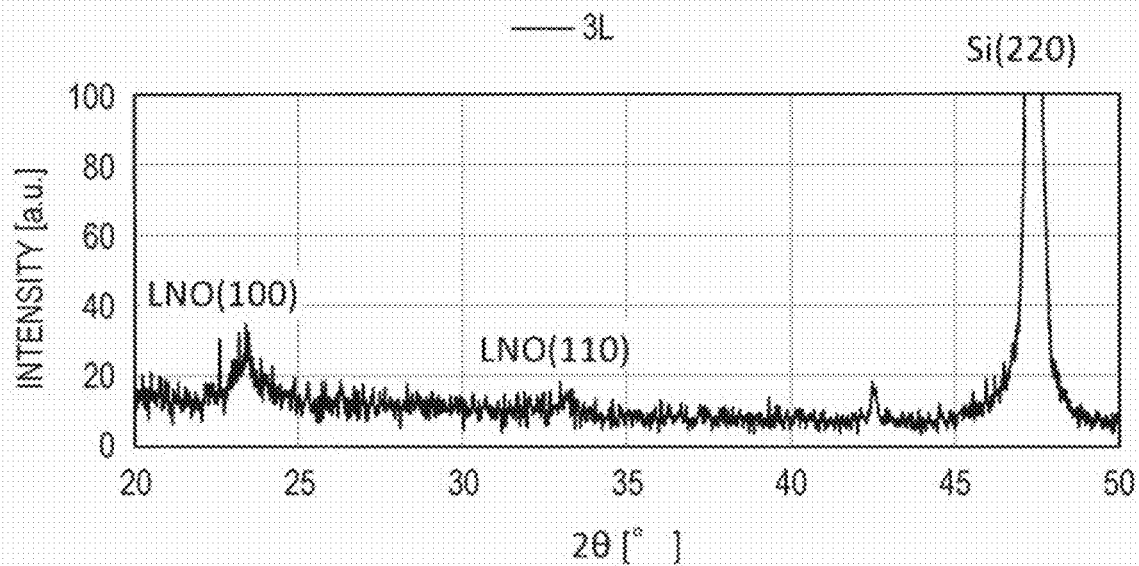
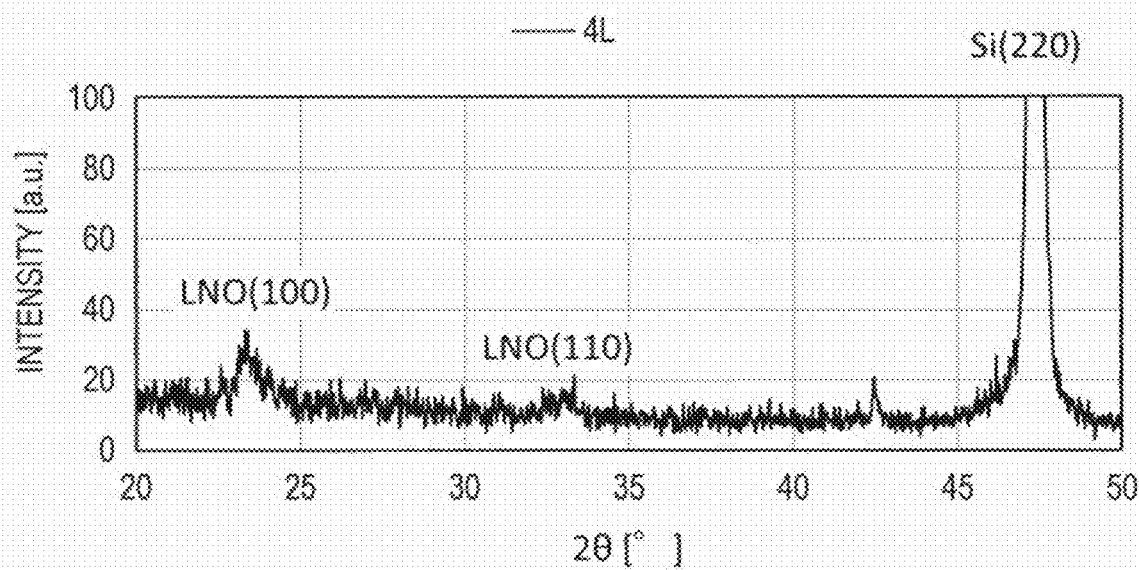

PIEZOELECTRIC DEVICE, LIQUID EJECTING HEAD, LIQUID EJECTING APPARATUS, AND METHOD FOR PRODUCING PIEZOELECTRIC DEVICE

The present application is based on, and claims priority from JP Application Serial Number 2020-130137, filed Jul. 31, 2020, the disclosure of which is hereby incorporated by reference herein in its entirety.

BACKGROUND

1. Technical Field

The present disclosure relates to a piezoelectric device, a liquid ejecting head, a liquid ejecting apparatus, and a method for producing a piezoelectric device. The piezoelectric device includes a diaphragm and a piezoelectric actuator having a first electrode, a piezoelectric layer, and a second electrode.

2. Related Art

A typical example of a liquid ejecting head, a type of piezoelectric device, is an ink jet recording head, i.e., a recording head that ejects ink droplets. A known example of an ink jet recording head is one that includes a flow-channel substrate and a piezoelectric actuator on one side of the flow-channel substrate, with a diaphragm between the substrate and the actuator. The flow-channel substrate has pressure chambers communicating with nozzles. The piezoelectric actuator causes changes in the pressure of ink inside the pressure chambers, thereby causing ink droplets to be ejected through the nozzles.

The piezoelectric actuator includes a first electrode on the diaphragm of the flow-channel substrate; a piezoelectric layer, i.e., a layer of a material capable of electromechanical transduction or a piezoelectric material, on the first electrode; and a second electrode on the piezoelectric layer.

As a measure to control the orientation of crystals in the piezoelectric layer, it has been proposed to use a configuration that includes a lanthanum nickelate (LNO) orientation control layer (for example, see JP-A-2009-234022).

There is a need for a configuration with which stable orientation of the piezoelectric layer on the diaphragm can be achieved, particularly when a non-crystalline (amorphous) diaphragm, for example of silicon oxide ($SiO_x$), is used.

Such a need is not unique to ink jet recording and other liquid ejecting heads. Similar needs exist for other piezoelectric devices, too.

SUMMARY

Under such circumstances, an object of the present disclosure is to provide a piezoelectric device having a piezoelectric layer with a preferred orientation. A liquid ejecting head, a liquid ejecting apparatus, and a method for producing a piezoelectric device are also provided.

To achieve this, an aspect of the present disclosure is a piezoelectric device that includes a diaphragm; a piezoelectric actuator having a first electrode, a piezoelectric layer, and a second electrode, the first electrode being on the diaphragm; and an orientation layer between the diaphragm and the piezoelectric layer, the orientation layer being a stack of two or more tiers.

Another aspect of the present disclosure is a liquid ejecting head that includes a substrate having a recess; a diaphragm on a first side of the substrate; a piezoelectric actuator having a first electrode, a piezoelectric layer, and a second electrode, the first electrode being on the diaphragm; and an orientation layer between the diaphragm and the piezoelectric layer, the orientation layer being a stack of two or more tiers.

Yet another aspect of the present disclosure is a liquid ejecting apparatus that includes a liquid ejecting head as described above.

Still another aspect of the present disclosure is a method for producing a piezoelectric device including a diaphragm; a piezoelectric actuator having a first electrode, a piezoelectric layer, and a second electrode, the first electrode being on the diaphragm; and an orientation layer between the diaphragm and the piezoelectric layer, the orientation layer being a stack of two or more tiers, the method including forming each tier of the orientation layer by a liquid phase method.

BRIEF DESCRIPTION OF THE DRAWINGS

FIG. 20 is an X-ray diffraction pattern obtained in Test Example 1.

FIG. 21 is an X-ray diffraction pattern obtained in Test Example 1.

DESCRIPTION OF EXEMPLARY EMBODIMENTS

Figure 1:
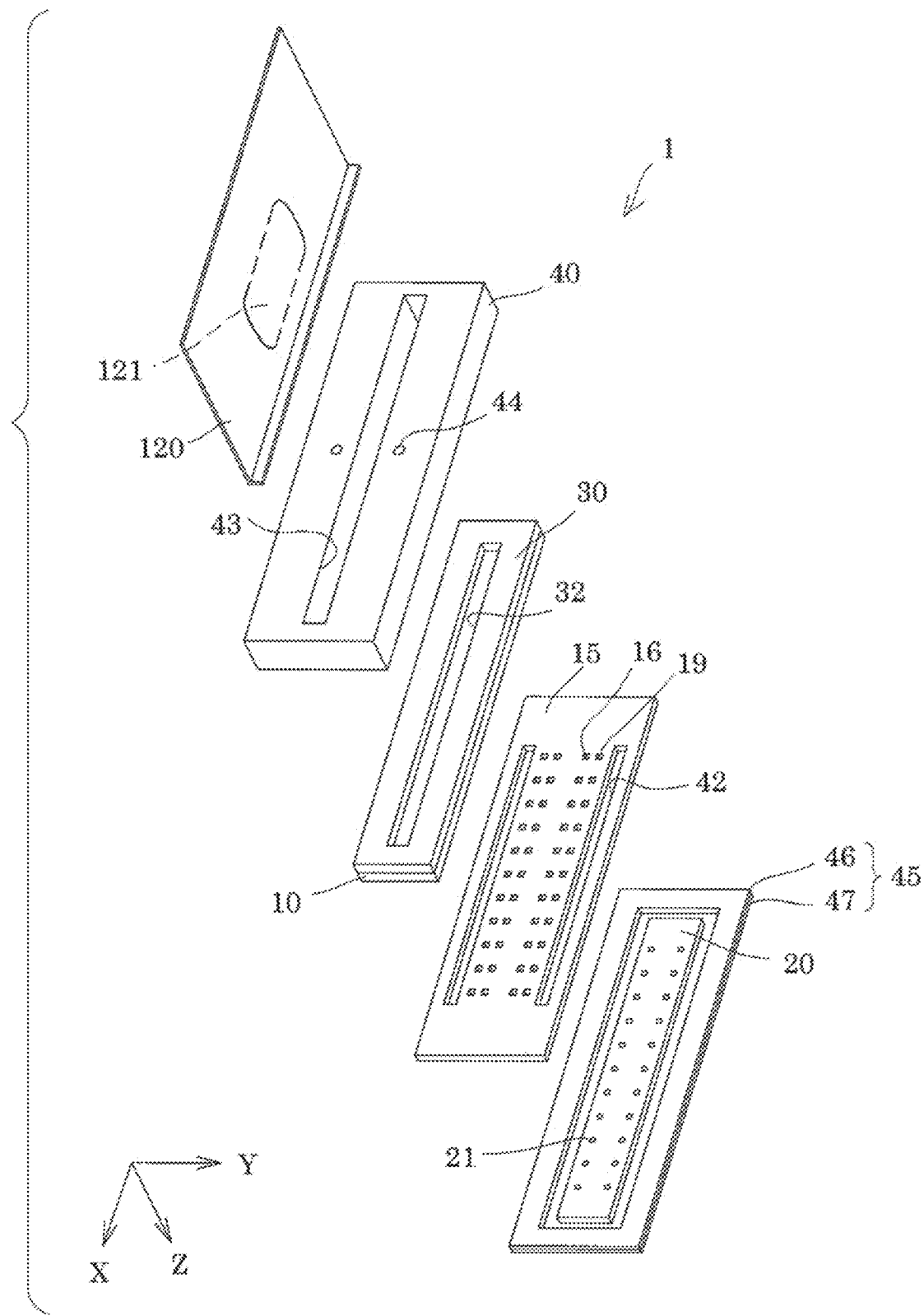
FIG. 1 is an exploded perspective view of a recording head according to Embodiment 1.

The following describes the present disclosure based on embodiments. The following description is about an aspect of the present disclosure, and any change can be made to the described configurations within the scope of the disclosure. Elements referenced by like numerals in the drawings represent like elements and may be described only once where appropriate. The letters X, Y, and Z in the drawings represent three spatial axes perpendicular to one another. The directions along these axes are herein referred to as the X, Y, and Z directions. In each drawing, the directions in which the arrows point are positive (+) directions, and the opposites are negative (−) directions. When a direction is along any of the three spatial axes of X, Y, and Z but can be either positive or negative, the term X-, Y-, or Z-axis is used. The Z direction represents the vertical, the +Z direction represents the downward vertical, and the −Z direction represents the upward vertical.

Embodiment 1

Figure 2:
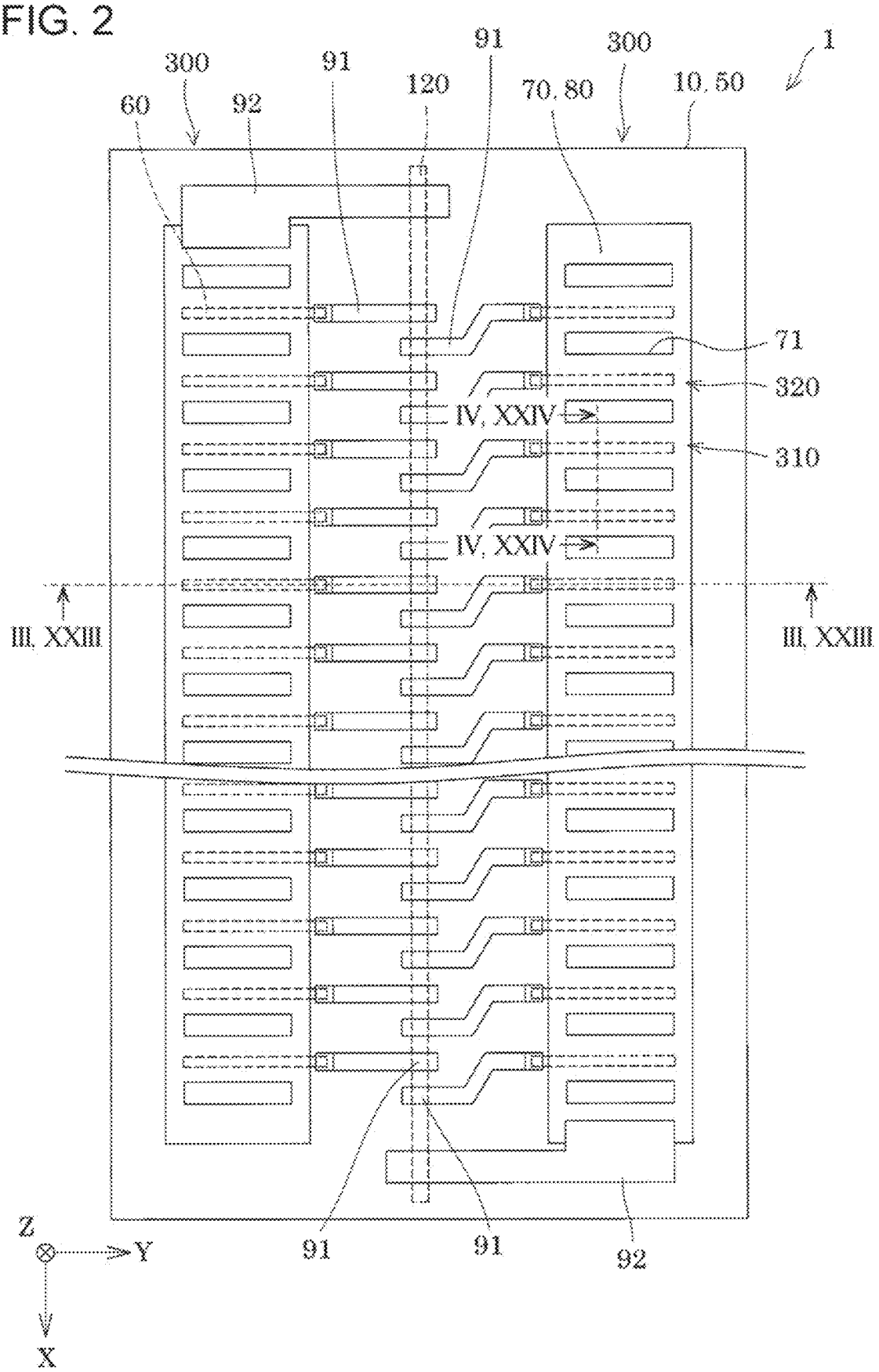
FIG. 2 is a plan view of a recording head according to Embodiment 1.
Figure 3:
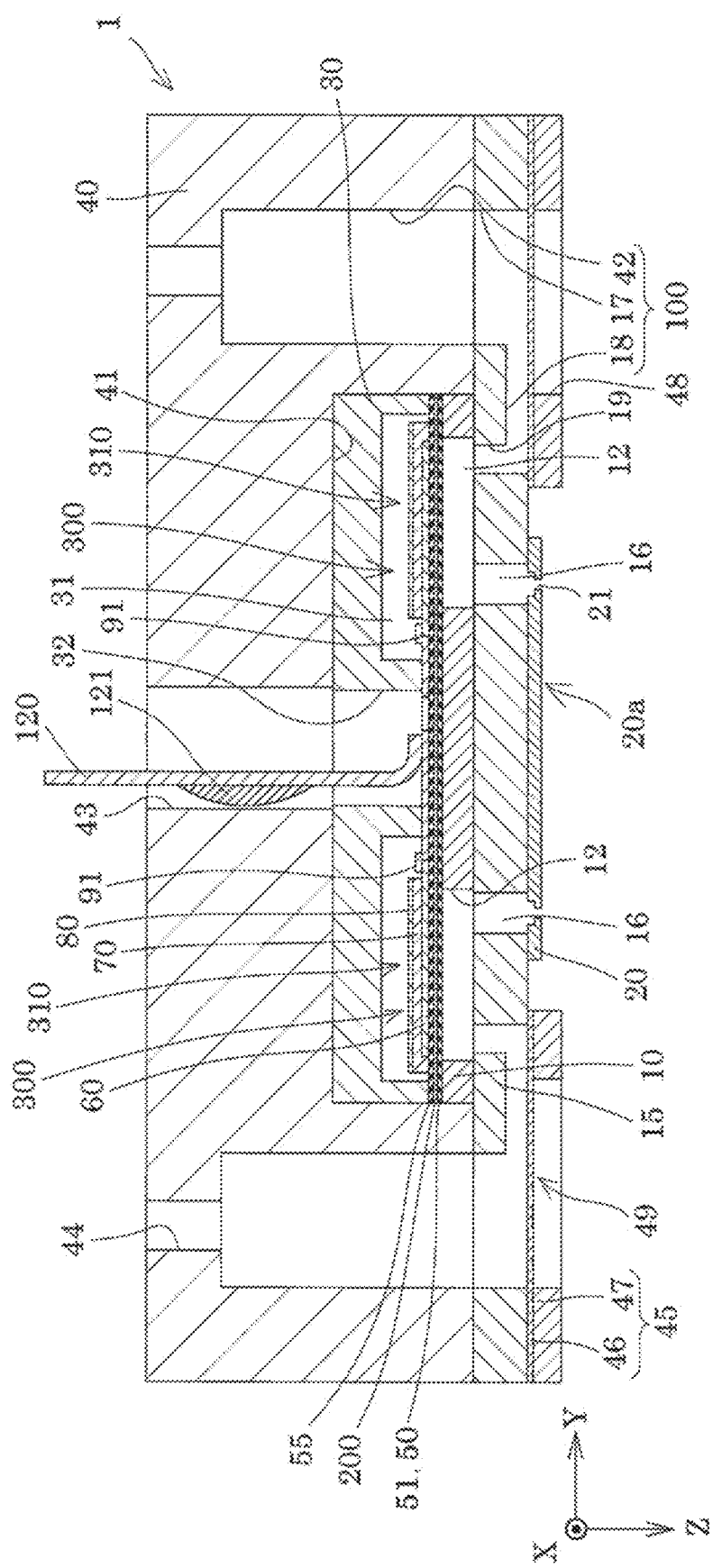
FIG. 3 is a cross-sectional view of a recording head according to Embodiment 1.
Figure 4:
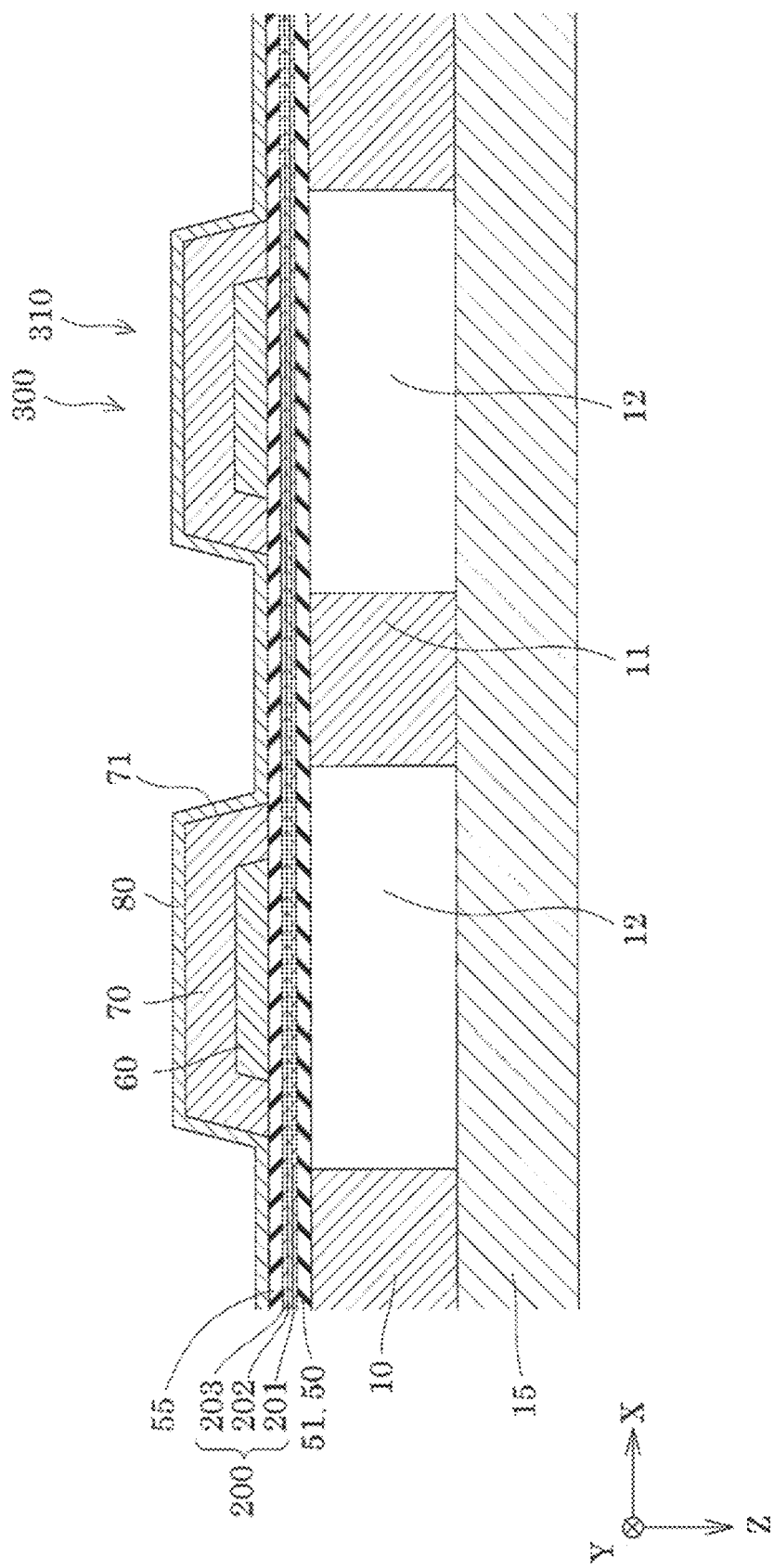
FIG. 4 is a cross-sectional view of a recording head according to Embodiment 1, illustrating essential components of the recording head.

FIG. 1 is an exploded perspective view of an ink jet recording head, an example of a liquid ejecting head, according to Embodiment 1 of an aspect of the present disclosure. FIG. 2 is a plan view of the recording head. FIG. 3 is a cross-sectional diagram along line III-III in FIG. 2. FIG. 4 is a cross-sectional diagram along line IV-IV in FIG. 2.

As illustrated in the drawings, an ink jet recording head 1 (hereinafter referred to simply as a recording head 1), an example of a liquid ejecting head, according to this embodiment includes a flow-channel substrate 10 as an example of a "substrate." The flow-channel substrate 10 is a silicon, glass, or SOI substrate or a ceramic substrate. As details will be given later herein, the flow-channel substrate 10 may be a (100) preferentially oriented substrate or may be a (110) preferentially oriented substrate.

The flow-channel substrate 10 has multiple pressure chambers 12 lined up in the +X direction, which is a first direction. The multiple pressure chambers 12 are arranged in straight lines parallel to the +X direction, taking the same positions in the +Y direction. Pressure chambers 12 adjacent in the +X direction are separated by a partition 11. Naturally, this is not the only possible arrangement of the pressure chambers 12. For example, the pressure chambers 12 may be in a "staggered" arrangement, in which pressure chambers 12 lined up in the +X direction are displaced in the +Y direction in an alternating pattern.

When viewed in the +Z direction, the shape of the pressure chambers 12 in this embodiment is usually a quadrilateral, parallelogram, or rectangular but may be what is called a rounded rectangle, i.e., a rectangle with semicircular longitudinal ends, or may be elliptical, egg-shaped, or oval, circular, polygonal, etc. These pressure chambers 12 correspond to the "recess" in the "substrate."

On the +Z side of the flow-channel substrate 10 is a stack of an interconnecting sheet 15 and a nozzle plate 20 thereon.

The interconnecting sheet 15 has nozzle paths 16, which interconnect the pressure chambers 12 and nozzles 21.

The interconnecting sheet 15 also includes first and second manifold portions 17 and 18. These manifold portions form part of manifolds 100, each of which provides a common liquid chamber multiple pressure chambers 12 communicate with. The first manifold portion 17 extends through the interconnecting sheet 15 in the +Z direction. The second manifold portion 18 opens in the +Z surface of the interconnecting sheet 15, not extending all the way through in the +Z direction.

The interconnecting sheet 15, moreover, has separate delivery paths 19 for the pressure chambers 12, each delivery path 19 leading to a Y-axis end of a pressure chamber 12. The delivery paths 19 connect the second manifold portion 18 and the pressure chambers 12 so that ink in the manifolds 100 will be delivered to the pressure chambers 12.

Configured as such, the interconnecting sheet 15 can be, for example, a silicon, glass, or SOI substrate, a ceramic substrate, or a stainless steel or other metal substrate. Preferably, the interconnecting sheet 15 is made of a material whose coefficient of thermal expansion is substantially the same as that of the flow-channel substrate 10. A difference in the coefficient of thermal expansion can cause the materials to warp when heated, and making the flow-channel substrate 10 and the interconnecting sheet 15 with materials having substantially equal thermal expansion coefficients helps prevent this type of warpage.

The nozzle plate 20 is on the side of the interconnecting sheet 15 opposite the flow-channel substrate 10, i.e., the +Z surface of the interconnecting sheet 15.

The nozzle plate 20 has nozzles 21 connected to the pressure chambers 12 by the nozzle paths 16. In this embodiment, there are two rows of nozzles 21 lined up in the +X direction, each row of nozzles 21 apart in the +Y direction. That is, the multiple nozzles 21 in each row are arranged to take the same positions in the +Y direction. Naturally, this is not the only possible arrangement of the nozzles 21. For example, the nozzles 21 may be in a "staggered" arrangement, in which nozzles 21 lined up in the +X direction are displaced in the +Y direction in an alternating pattern. Configured as such, the nozzle plate 20 can be, for example, a silicon, glass, or SOI substrate, a ceramic substrate, a stainless steel or other metal substrate, or a substrate made of an organic substance, such as a polyimide resin. Preferably, the nozzle plate 20 is made of a material whose coefficient of thermal expansion is substantially the same as that of the interconnecting sheet 15. A difference in the coefficient of thermal expansion can cause the materials to warp when heated, and making the nozzle plate 20 and the interconnecting sheet 15 with materials having substantially equal thermal expansion coefficients helps prevent this type of warpage.

On the −Z surface of the interconnecting sheet 15 is a casing 40 fastened thereto. The casing 40 has a third manifold portion 42 communicating with the first manifold portion 17. The first and second manifold portions 17 and 18, which are in the interconnecting sheet 15, and the third manifold portion 42, which is in the casing 40, together form manifolds 100 in this embodiment. The manifolds 100 are continuous in the +X direction, in which the pressure chambers 12 are lined up, and the delivery paths 19, which connect the pressure chambers 12 and the manifolds 100, are lined up in the +X direction. The casing 40 also has inlets 44, which communicate with the manifolds 100 and provide openings through which ink can be delivered to each manifold 100. The casing 40, moreover, has a connecting port 43, which communicates with a through hole 32 of a protecting substrate 30 (details will be given later herein) and provides an opening into which a wiring board 120 is inserted.

On the +Z surface of the interconnecting sheet 15, in which the first and second manifold portions 17 and 18 open, there is a compliant substrate 45. This compliant substrate 45 seals the opening on the +Z side of the first and second manifold portions 17 and 18. Configured as such, the compliant substrate 45 in this embodiment includes a sealing membrane 46, which is a flexible thin film, and a stationary substrate 47, which is made of metal or other hard material. The regions of the stationary substrate 47 facing the manifolds 100 are openings 48 created by removing these regions of the stationary substrate 47 all the way in the direction of thickness; therefore, one side of the manifolds 100 is a compliant portion 49 that is sealed only with a flexible sealing membrane 46 and therefore is flexible. This compliant portion 49 undergoes flexural deformation to absorb changes in the pressure of ink inside the manifolds 100.

On the −Z surface of the flow-channel substrate 10 is a stack of a diaphragm 50, an orientation layer 200, an insulating film 55 thereon, and piezoelectric actuators 300 thereon each having a first electrode 60, a piezoelectric layer 70, and a second electrode 80.

The diaphragm 50, which is on the flow-channel substrate 10 side, is an elastic film 51 containing silicon oxide ($SiO_x$), for example silicon dioxide ($SiO_2$). The elastic film 51 containing silicon oxide may contain any other material as long as it is primarily silicon oxide. When it is stated herein that an elastic film 51 is primarily silicon oxide, it means the silicon oxide content of the elastic film 51 is 50% by mass or more. Configured as such, the elastic film 51 containing silicon oxide is usually amorphous (non-crystalline). The flow passages, such as the pressure chambers 12, are created by anisotropic etching of the flow-channel substrate 10 from its +Z surface, and the end on the −Z side of the pressure chambers 12 is demarcated by the elastic film 51. That is, by virtue of the diaphragm 50, which is on the flow-channel substrate 10 side, being an elastic film 51 containing silicon oxide, this elastic film 51 can be used as an etch-stop layer when the flow-channel substrate 10 is etched from the surface opposite the diaphragm 50 by anisotropic etching with KOH or other alkali solution. The pressure chambers 12 are therefore created densely and precisely in the flow-channel substrate 10 by anisotropic etching, and the risk of unevenness in the thickness of the diaphragm 50 is reduced. Naturally, anisotropic etching is not the only possible method for creating the pressure chambers 12; dry etching, for example, can also be used. The elastic film 51, furthermore, does not need to be a film of silicon oxide. For example, the elastic film 51 may be part of the flow-channel substrate 10. That is, the elastic film 51 may be part of a silicon, glass, or SOI substrate or part of a ceramic substrate. Alternatively, the elastic film 51 may be a film of zirconium oxide ($ZrO_x$), such as zirconium dioxide ($ZrO_2$), silicon nitride ($Si_3N_4$), titanium oxide ($TiO_2$), aluminum oxide ($Al_2O_3$), hafnium oxide ($HfO_2$), magnesium oxide (MgO), or lanthanum aluminate ($LaAlO_3$). The elastic film 51 may even be an organic film, for example of polyimide or parylene. The elastic film 51 does not need to be non-crystalline (amorphous) but may be one that has a crystal structure with a preferred orientation, such as a film of monocrystalline Si. As details will be given later herein, this is because the lowermost tier of the multi-tiered orientation layer 200, which is formed on the elastic film 51, functions as a buffer layer that limits the influence of the underlying elastic film 51. When the elastic film 51 has a crystal structure with a preferred orientation, it would be good to interpose an amorphous layer between the elastic film 51 and the orientation layer 200 to reduce the risk of the negative effect of reduced degree of orientation of the orientation layer 200.

On the elastic film 51 configured as such, there is an orientation layer 200. The orientation layer 200 is for controlling the orientation of any film on or above, or on the −Z side of, the orientation layer 200. The term on or above here means that the film may be directly on the orientation layer 200, or there may be another component interposed between the film and the orientation layer 200. Configures as such, the orientation layer 200 is a stack of two or more tiers. When it is stated herein that an orientation layer 200 is a stack of two or more tiers, it means each tier of the orientation layer 200 is stacked in the direction of stacking of the diaphragm 50 and the piezoelectric layer 70 with an interface therebetween. This interface between each tier of the orientation layer 200 is one resulting from the formation of each tier by firing, or from thermal insulation of each tier during its formation. By virtue of the orientation layer 200 being a stack of two or more tiers with an interface therebetween, the lowermost tier, which is on the diaphragm 50 side, functions as a buffer layer that limits the influence of the underlying diaphragm 50. The uppermost tier, on the piezoelectric layer 70 side, of the orientation layer 200 therefore achieves a preferred orientation through self-assembly with limited influence of the underlying diaphragm 50 owing to the buffer layer. Preferably, the orientation layer 200 is a stack of three or more tiers. In that case, the uppermost tier of the orientation layer 200 achieves a preferred orientation with a higher degree of orientation. When the orientation layer 200 has too many tiers, however, its production is complicated and costly because of increased operations, and the total thickness of the orientation layer 200 is relatively large, which may cause the orientation layer 200 to hinder the deformation of the piezoelectric actuators 300. It is therefore preferred that the orientation layer 200 be a stack of three tiers. Preferably, each tier of the orientation layer 200 has a thickness, in the +Z direction, of 10 nm or less, and the total thickness, in the +Z direction, of the orientation layer 200 is 5 nm or more and 20 nm or less. When relatively thin like that, the orientation layer 200 does not easily interfere with the displacement of the piezoelectric actuators 300. The piezoelectric actuators 300 are therefore improved in terms of displacement characteristics, or achieve a large displacement with a relatively low voltage.

Each tier of the orientation layer 200 configured as such can be formed by a gas-phase film formation process (also abbreviated to a gas-phase process), such as sputtering, physical vapor deposition (PVD), or laser ablation, or a liquid phase film formation method (also abbreviated to a liquid phase method), such as MOD or the sol-gel process. Preferably, each tier of the orientation layer 200 is formed by a liquid phase method because films formed by a liquid phase method are relatively thin compared with those formed by a gas-phase process.

In this embodiment, as illustrated in FIG. 4, the orientation layer 200 is a stack of first, second, and third tiers 201, 202, and 203, from the diaphragm 50 side to the piezoelectric actuator 300 side, or from the +Z side to the −Z side.

Configured as such, the orientation layer 200 can be made of material(s) that has a strong tendency toward self-assembly to the orientation of the piezoelectric layer 70, the (100) plane in this embodiment. Specifically, the orientation layer 200 contains, for example, at least one selected from LaNi$_y$O$_x$ (abbreviated to LNO), SrRu$_y$O$_x$ (SRO), (Ba,Sr)Ti$_y$O$_x$ (BST), and (Bi,Fe)Ti$_y$O$_x$ (BFT). For this to be achieved, it is only needed that each of the first, second, and third tiers 201, 202, and 203 contain at least one selected from LNO, SRO, BST, and BFT. When it is stated herein that each of first, second, and third tiers 201, 202, and 203 contains at least one selected from LNO, SRO, BST, and BFT, it means the percentage of the one or two or more selected from LNO, SRO, BST, and BFT in each tier is 50% by mass or more. The first, second, and third tiers 201, 202, and 203 may contain the same material(s) or may contain different materials. Preferably, the first and second tiers 201 and 202, the second and third tiers 202 and 203, or all three of the first, second, and third tiers 201, 202, and 203 are made of the same material(s) or contain the same material(s) because this facilitates orientation. It is particularly preferred that the first tier 201, which serves as a buffer layer, and the second tier 202 be made of the same material(s) or contain the same material(s) because this improves the degree of orientation. Preferably, the tiers of the orientation layer 200 are made of materials, even when different, having similar lattice constants, specifically similar a-axis lattice constants. Using materials having similar lattice constants as materials for the tiers of the orientation layer 200 makes the lattice matching between the tiers of the orientation layer 200 easier, thereby allowing the top tier, which is on the piezoelectric layer 70 side, of the orientation layer 200 to achieve a preferred orientation to a higher degree. Naturally, it is preferred that each tier of the orientation layer 200 contain the same material(s). Using the same material(s) in each tier of the orientation layer 200 makes the lattice matching between the tiers of the orientation layer 200 even easier, thereby allowing the top tier, which is on the piezoelectric layer 70 side, of the orientation layer 200 to achieve a preferred orientation to an even higher degree. Using the same material(s) in each tier of the orientation layer 200 also eliminates the need for changing the material(s) from tier to tier, thereby helping reduce the cost and complexity of the production of the orientation layer 200. When it is stated herein that each tier of the orientation layer 200 contains the same material(s), it means the same element(s) is contained. That is, each tier of the orientation layer 200 in that case may vary in crystal structure and/or elemental composition as long as the same element(s) is used therein. When it is stated herein that each tier of the orientation layer 200 contains the same material(s), furthermore, it also includes the case in which each tier of the orientation layer 200 is produced from the same raw material(s).

Preferably, the orientation layer 200 is made of LNO. LNO has a particularly strong tendency toward self-assembly among the listed materials, and, therefore, using LNO as the material for the orientation layer 200 helps increase the degree of orientation of the uppermost tier of the multi-tiered orientation layer 200. When LNO is used as the material for the orientation layer 200, therefore, the uppermost tier of the multi-tiered orientation layer 200 has an increased degree of orientation, which improves the degree of orientation of the piezoelectric layer 70, which is formed on or above the orientation layer 200. As a result, the displacement of the piezoelectric layer 70 becomes more efficient. In this embodiment, each tier of the orientation layer 200 is made of, for example, LaNiO$_3$, LaNi$_y$O$_x$ where x=3 and y=1.

The first tier 201 functions as a buffer layer that limits the influence of the underlying layer to ensure that the second 202 and other tier(s) above the first tier 201 are (100) preferentially oriented. The first tier 201 itself is a buffer layer that is not very (100) preferentially oriented.

The second tier 202, which is on the first tier 201, is more (100) preferentially oriented than the first tier 201 as a result of self-assembly without influence of the underlying elastic film 51 by virtue of the first tier 201 acting as a buffer.

The third tier 203, which is on the second tier 202, is (100) preferentially oriented with an even higher degree of orientation than the second tier 202 as a result of epitaxial growth on the (100) preferentially oriented second tier 202.

As mentioned herein, a preferred orientation means 50% or more, preferably 80% or more, of crystals are oriented in a particular crystal plane. For example, when it is stated herein that a tier/layer is "(100) preferentially oriented," it may mean that all crystals in that tier/layer are oriented in the (100) plane or that half or more (50% or more in other words, preferably 80% or more) of the crystals are oriented in the (100) plane.

Overall, the orientation layer 200 is a stack of two or more tiers, and, by virtue of this, its lowermost first tier 201 functions as a buffer layer that buffers the influence of the underlying diaphragm 50, and the second and third tiers 202 and 203, which are above the first tier 201, carry out self-assembly with limited influence of the underlying diaphragm 50. On or above this orientation layer 200, the piezoelectric layer 70 is orientationally controlled by the orientation layer 200.

Preferably, the orientation layer 200 has a (100) preferentially oriented uppermost tier, which is on the piezoelectric layer 70 side. In that case, the piezoelectric layer 70, which is on or above the orientation layer 200, is (100) preferentially oriented with a higher degree of orientation and therefore has a relatively large piezoelectric constant d31.

On the orientation layer 200 is an insulating film 55 that is electrically insulating. In this embodiment, it is preferred that the insulating film 55 contain zirconium oxide (ZrO$_x$), for example zirconium dioxide (ZrO$_2$). The insulating film 55 containing zirconium oxide may contain any other material as long as it is primarily zirconium oxide. When it is stated herein that an insulating film 55 is primarily zirconium oxide, it means the zirconium oxide content of the insulating film 55 is 50% by mass or more. An insulating film 55 containing zirconium oxide helps prevent constituents of the piezoelectric layer 70 (details will be given later herein), such as lead (Pb) and bismuth (Bi), from diffusing down below the insulating film 55, or into the elastic film 51 and/or the flow-channel substrate 10. With an insulating film 55 containing zirconium oxide, therefore, problems caused by the diffusion of constituents of the piezoelectric layer 70 into the elastic film 51 and/or the flow-channel substrate 10, such as reduced rigidity, can be prevented. An insulating film 55 containing zirconium oxide also helps prevent constituents of the orientation layer 200, for example lanthanum (La) and nickel (Ni) when LNO is used, from diffusing into the piezoelectric layer 70. With such an insulating film 55, therefore, the risk of accumulation of diffused lanthanum and/or nickel in the piezoelectric layer 70 on its orientation layer 200 side is reduced, and, therefore, the possibility of unevenness in the composition of the piezoelectric layer 70 in the +Z direction is lowered.

The insulating film 55 can be made of any material whose lattice structure can be matched to that of the orientation layer 200. Preferably, the insulating film 55 is made of a material whose a-axis lattice constant is, for example, within ±5% of that of the orientation layer 200. This ensures the insulating film 55 is formed on the orientation layer 200 with a matched lattice structure. Examples of such materials that may be used for the insulating film 55 include silicon nitride ($Si_3N_4$), titanium oxide ($TiO_2$), aluminum oxide ($Al_2O_3$), hafnium oxide ($HfO_2$), magnesium oxide (MgO), and lanthanum aluminate ($LaAlO_3$).

By virtue of the insulating film 55 being made of an electrically insulating material, furthermore, the divisions of the first electrode 60 for separate active portions 310 (details will be given later herein) are prevented from being short-circuited by the orientation layer 200. It should be noted that even when the first electrode 60 is a common electrode shared by multiple active portions 310, the insulating film 55 needs to be electrically insulating. When the insulating film 55 were electrically conductive, it would cause an electric field to be applied to the piezoelectric layer 70 through the portions of the insulating film 55 not covered by the first electrode 60.

On the −Z surface of the insulating film 55 configured as such, there are piezoelectric actuators 300 that cause changes in the pressure of ink inside the pressure chambers 12 by making the diaphragm 50 undergo flexural deformation. A piezoelectric actuator 300 includes a stack of a first electrode 60, a piezoelectric layer 70 thereon, and a second electrode 80 thereon, from the +Z side, which is the diaphragm 50 side, to the −Z side. A piezoelectric actuator 300 is a pressure generator that causes changes in the pressure of ink inside pressure chambers 12. Configured as such, a piezoelectric actuator 300, also referred to as a piezoelectric element, represents a portion of the recording head 1 including a first electrode 60, a piezoelectric layer 70, and a second electrode 80. The portions of a piezoelectric actuator 300 in which the piezoelectric layer 70 undergoes piezoelectric strain when a voltage is applied across the first and second electrodes 60 and 80 are referred to as active portions 310. The portions in which the piezoelectric layer 70 does not are referred to as inactive portions. In other words, the active portions 310 are the portions in which the piezoelectric layer 70 is sandwiched between the first and second electrodes 60 and 80. In this embodiment, there are separate active portions 310 for the pressure chambers 12, which constitute the recess. That is, each piezoelectric actuator 300 has multiple active portions 310. Usually, one of the two electrodes in the active portions 310 is configured as a set of separate electrodes each of which independently serves for one active portion 310, and the other as a common electrode shared by multiple active portions 310. In this embodiment, the first electrode 60 is a set of separate electrodes, and the second electrode 80 is a common electrode. Naturally, it may be that the first electrode 60 is a common electrode with the second electrode 80 being a set of separate electrodes. The portions of the piezoelectric actuator 300 facing the pressure chambers 12 in the direction along the Z-axis constitute a flexible component, and the portion extending outside the edges of the pressure chambers 12 is an inflexible component.

Specifically, as illustrated in FIGS. 2 and 3, the first electrode 60 is divided for separate pressure chambers 12 to provide separate electrodes each of which independently serves for one active portion 310. In the +X direction, the first electrode 60 is narrower than the pressure chambers 12. In other words, in the +X direction, the ends of the first electrode 60 are inside the regions of the piezoelectric actuator 300 facing the pressure chambers 12. As illustrated in FIG. 3, in the direction along the Y-axis, the end of the first electrode 60 closer to the nozzles 21 is outside the edge of the pressure chambers 12. To this end of the first electrode 60, positioned outside the edge of the pressure chambers 12 in the direction along the Y-axis, are coupled separate lead electrodes 91, which are lead-out wires.

Configured as such, the first electrode 60 is made of an electrically conductive material. A material having a crystal structure can be used as long as an electrode can be made from it on or above the orientation layer 200. Examples of such materials for the first electrode 60 include iridium (Ir), platinum (Pt), palladium (Pd), gold (Au), nickel (Ni), chromium (Cr), nickel chromium (NiCr), tungsten (W), titanium (Ti), titanium oxide (TiOx), and titanium tungsten (TiW).

The piezoelectric layer 70, as illustrated in FIGS. 2 to 4, has a predetermined width, in the +Y direction, and is continuous in the +X direction. The width, in the +Y direction, of the piezoelectric layer 70 is longer than the length in the +Y direction, which is the longitudinal direction, of the pressure chambers 12. At the +Y and −Y ends of the pressure chambers 12, therefore, the piezoelectric layer 70 extends to the outside of the regions of the piezoelectric actuator 300 facing the pressure chambers 12. The end of the piezoelectric layer 70 configured as such opposite the nozzles 21 in the direction along the Y-axis is outside the edge of the first electrode 60. That is, the end of the first electrode 60 opposite the nozzles 21 is covered with the piezoelectric layer 70. The end of the piezoelectric layer 70 closer to the nozzles 21 is inside the edge of the first electrode 60; therefore, the end of the first electrode 60 closer to the nozzles 21 is not covered with the piezoelectric layer 70. As stated, to the end of the first electrode 60 extending to the outside of the edge of the piezoelectric layer 70, separate lead electrodes 91, for example made of gold (Au), are coupled.

The piezoelectric layer 70 also has recesses 71 corresponding to the partitions 11. The width, in the +X direction, of these recesses 71 is equal to or broader than that of the partitions 11. In this embodiment, the width, in the +X direction, of the recesses 71 is broader than that of the partitions 11. By virtue of this, the portions of the diaphragm 50, orientation layer 200, and insulating film 55 facing the +X and −X ends of the pressure chambers 12, or the "arms" of the diaphragm 50, are not very rigid, ensuring good displacement of the piezoelectric actuator 300. The recesses 71 may extend all the way through the piezoelectric layer 70 in the +Z direction, or in the direction of thickness, or may extend partway into the piezoelectric layer 70 in the direction of thickness, not all the way through the piezoelectric layer 70 in the +Z direction. That is, the bottom, in the +Z direction, of the recesses 71 may be completely clear of the piezoelectric layer 70, or part of the piezoelectric layer 70 may remain there.

Configured as such, the piezoelectric layer 70 is a layer of a piezoelectric material that is a perovskite composite oxide, represented by the general formula $ABO_3$. In this embodiment, the piezoelectric material is lead zirconate titanate (PZT; $Pb(Zr,Ti)O_3$). By virtue of the piezoelectric material being PZT, the piezoelectric layer 70 has a relatively large piezoelectric constant d31.

In a perovskite composite oxide, represented by the general formula $ABO_3$, the A site has a 12-fold oxygen coordination, and the B site has a 6-fold oxygen coordination, making octahedra. In this embodiment, the A site is occupied by lead (Pb), and the B site is occupied by zirconium (Zr) and titanium (Ti).

The piezoelectric material does not need to be PZT. Any other element may be contained in the A and/or B site. For example, the piezoelectric material may be a perovskite material such as barium zirconate titanate ($Ba(Zr,Ti)O_3$), lead lanthanum zirconate titanate (($Pb,La$) $(Zr,Ti)O_3$), lead zirconium titanate magnesium niobate (Pb(Zr,Ti) (Mg,Nb) O₃), or silicon-containing lead zirconate titanate niobate (Pb(Zr,Ti,Nb)O₃).

In addition to these, the piezoelectric material may be a material containing a reduced percentage of Pb, or a so-called "low-lead" material, or a material in which no Pb is used, or a so-called "lead-free" material. When the piezoelectric material is lead-free, no Pb needs to be used throughout. Using a low-lead or lead-free material as the piezoelectric material therefore helps reduce environmental burdens.

Examples of lead-free piezoelectric materials include bismuth ferrite (BFO; BiFeO₃) and other BFO materials. In BFO, the A site is occupied by Bi, and the B site is occupied by iron (Fe). BFO doped with other element(s) may also be used. For example, BFO doped with at least one element selected from the following may be used: manganese (Mn), aluminum (Al), lanthanum (La), barium (Ba), titanium (Ti), cobalt (Co), cerium (Ce), samarium (Sm), chromium (Cr), potassium (K), lithium (Li), calcium (Ca), strontium (Sr), vanadium (V), niobium (Nb), tantalum (Ta), molybdenum (Mo), tungsten (W), nickel (Ni), zinc (Zn), praseodymium (Pr), neodymium (Nd), and europium (Eu).

Other examples of lead-free piezoelectric materials include potassium sodium niobate (KNN; KNaNbO₃) and other KNN materials. KNN doped with other element(s) may also be used. For example, KNN doped with at least one element selected from the following may be used: manganese (Mn), lithium (Li), barium (Ba), calcium (Ca), strontium (Sr), zirconium (Zr), titanium (Ti), bismuth (Bi), tantalum (Ta), antimony (Sb), iron (Fe), cobalt (Co), silver (Ag), magnesium (Mg), zinc (Zn), copper (Cu), vanadium (V), chromium (Cr), molybdenum (Mo), tungsten (W), nickel (Ni), aluminum (Al), silicon (Si), lanthanum (La), cerium (Ce), praseodymium (Pr), neodymium (Nd), promethium (Pm), samarium (Sm), and europium (Eu).

Piezoelectric materials also include materials yielded by deleting atoms of element(s) from, adding atoms of element(s) to, or replacing atoms of element(s) with those of other element(s) in the original composition. The piezoelectric material according to this embodiment can even be a material having a non-stoichiometric composition as a result of a deletion or addition or a material in which atoms of element(s) have been replaced with those of other element(s) unless it causes the basic characteristics of the piezoelectric layer 70 to change. Naturally, the piezoelectric materials that can be used in this embodiment are not limited to such materials containing Pb, Bi, Na, K, etc., as mentioned above.

Configured as such, the piezoelectric layer 70 is (100) preferentially oriented by virtue of being formed on or above the orientation layer 200, which has a (100) preferentially oriented uppermost tier. As for thickness, the piezoelectric layer 70 is formed thin so that it will not crack during the production process but thick enough that its displacement characteristics will be satisfactory (0.5 to 5 μm).

Table 1 presents the orientations and a-axis lattice constants of a silicon monocrystalline flow-channel substrate 10, an LNO orientation layer 200, a zirconium dioxide (ZrO₂) insulating film 55, a platinum (Pt) first electrode 60, and a PZT piezoelectric layer 70 by way of example. As for the elastic film 51, Table 1 presents the orientations and lattice constants of an underlying silicon monocrystalline substrate instead because the elastic film 51 is amorphous.

TABLE 1

| Material | Orientation | Lattice constant a (Å) |
|---|---|---|
| Piezoelectric layer 70 (PZT) | (100)preferentially oriented | 4.01 |
| First electrode 60 (Pt) | (100)preferentially oriented | 3.92 |
| Insulating film 55 (ZrO₂) | (110)preferentially oriented | 5.14 |
| Orientation layer 200 (LNO) | (100)preferentially oriented | 3.98 |
| Flow-channel substrate 10 (Si) | (100)preferentially oriented | 5.43 |
| Flow-channel substrate 10 (Si) | (110)preferentially oriented | 7.68 |

The lattice constant of LNO, the material for the orientation layer 200, 3.98 Å, times $2^{1/2}$ gives 5.63 Å. This means the lattice structure of the zirconium dioxide (ZrO₂) insulating film 55 matches that of the LNO orientation layer 200 when rotated by 45° in the XY plane. On this insulating film 55, the platinum (Pt) first electrode 60 is formed (100) preferentially oriented as a result of lattice matching with the insulating film 55. The (100) preferentially oriented platinum (Pt) first electrode 60 has a (100) lattice constant close to that of the PZT piezoelectric layer 70. The piezoelectric layer 70 is therefore (100) preferentially oriented on the first electrode 60.

The second electrode 80 is, as illustrated in FIGS. 2 to 4, extends continuously on the −Z side, opposite the first electrode 60, of the piezoelectric layer 70, providing a common electrode shared by multiple active portions 310. The second electrode 80 is continuous in the +X direction in such a manner as to have a predetermined width in the +Y dimension. The second electrode 80, moreover, extends to cover the inner surface of the recesses 71, i.e., the sides of the recesses 71 in the piezoelectric layer 70 and the areas of the insulating film 55 forming the bottom of the recesses 71. Naturally, the second electrode 80 may be formed to cover only part of the inner surface of the recesses 71; the second electrode 80 does not need to be formed throughout the inner surface of the recesses 71.

From the first electrode 60, separate lead electrodes 91, which are lead-out wires, extend. From the second electrode 80, a common lead electrode 92, which is a lead-out wire, extends. The end of these separate and common lead electrodes 91 and 92 opposite the end coupled to the piezoelectric actuator 300 is coupled to a flexible wiring board 120. On the wiring board 120 is mounted a driver 121 having switching elements for driving the piezoelectric actuators 300.

On the −Z surface of the flow-channel substrate 10, with the piezoelectric actuators 300 configured as such thereon, there is a protecting substrate 30 bonded thereto having substantially the same size as the flow-channel substrate 10, as illustrated in FIGS. 1 and 3. The protecting substrate 30 has retaining portions 31, which are spaces in which the piezoelectric actuators 300 are protected. There are two retaining portions 31 side-by-side in the +Y direction, each independently serving for one row of piezoelectric actuators 300 lined up in the +X direction. The protecting substrate 30 also has a through hole 32 extending in the +Z direction between the two retaining portions 31 side-by-side in the +Y direction. The separate and common lead electrodes 91 and 92, extending from the electrodes of the piezoelectric actuators 300, have their end exposed inside this through hole 32, and the separate and common lead electrodes 91 and 92 are electrically coupled to the wiring board 120 inside the through hole 32.

On the protecting substrate 30 is a casing 40 fastened thereto, demarcating manifolds 100 each communicating with multiple pressure chambers 12 together with the flow-channel substrate 10 as illustrated in FIG. 3. Having substantially the same shape as the interconnecting sheet 15 in plan view, the casing 40 is bonded to the protecting substrate 30 and also to the interconnecting sheet 15. In this embodiment, the casing 40 is bonded to the interconnecting sheet 15. Although not illustrated, the casing 40 and the protecting substrate 30 are also bonded together.

Configured as such, the casing 40 has, on its protecting substrate 30 side, a recess 41 deep enough to accommodate the flow-channel substrate 10 and the protecting substrate 30. The opening of this recess 41 is larger in area than the surface of the protecting substrate 30 bonded to the flow-channel substrate 10. With the flow-channel substrate 10, etc., in the recess 41, the opening on the nozzle plate 20 side of the recess 41 is sealed with the interconnecting sheet 15. As a result, there is a third manifold portion 42 around the flow-channel substrate 10, demarcated by the casing 40 and the flow-channel substrate 10, and the first and second manifold portions 17 and 18, which are in the interconnecting sheet 15, and the third manifold portion 42, demarcated by the casing 40 and the flow-channel substrate 10, form manifolds 100 in this embodiment. The manifolds 100 are continuous in the +X direction, in which the pressure chambers 12 are lined up, and the delivery paths 19, which interconnect the pressure chambers 12 and the manifolds 100, are lined up in the +X direction.

On the +Z surface of the interconnecting sheet 15, in which the first and second manifold portions 17 and 18 open, there is a compliant substrate 45. This compliant substrate 45 seals the opening on the liquid ejecting surface 20a side of the first and second manifold portions 17 and 18. Configured as such, the compliant substrate 45 in this embodiment includes a sealing membrane 46, which is a flexible thin film, and a stationary substrate 47, which is made of metal or other hard material. The regions of the stationary substrate 47 facing the manifolds 100 are openings 48 created by removing these regions of the stationary substrate 47 all the way in the direction of thickness; therefore, one side of the manifolds 100 is a compliant portion 49 that is sealed only with a flexible sealing membrane 46 and therefore is flexible.

The following describes the production of recording heads 1 according to this embodiment configured as such. FIGS. 5 to 17 are cross-sectional diagrams illustrating a method for producing recording heads according to this embodiment.

Figure 5:
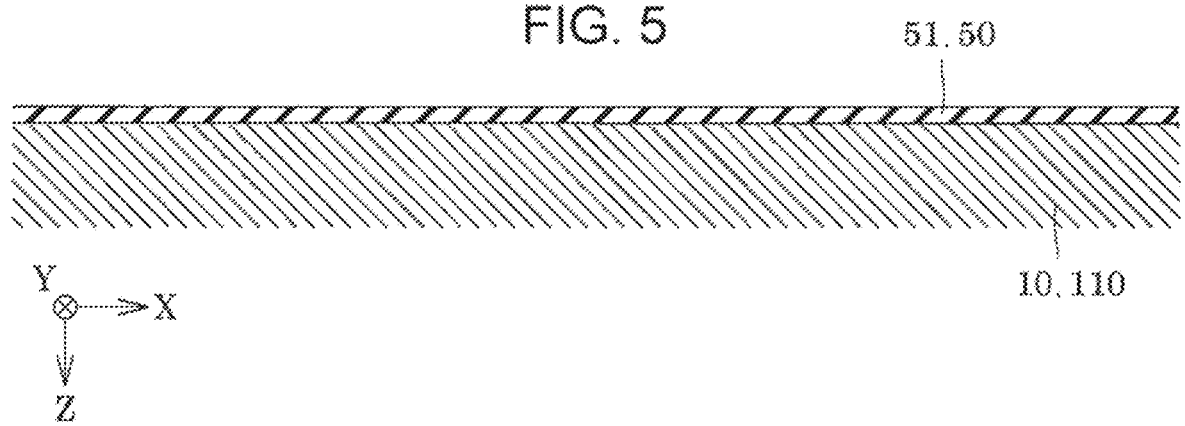
FIG. 5 is a cross-sectional diagram illustrating a method for producing recording heads according to Embodiment 1.

First, as illustrated in FIG. 5, an elastic film 51 is formed on the surface of a flow-channel substrate wafer 110, which will be cut into flow-channel substrates 10. In this embodiment, a silicon dioxide ($SiO_2$) elastic film 51 is formed by thermally oxidizing the flow-channel substrate wafer 110. Naturally, $SiO_2$ is not the only possible material for the elastic film 51; other materials such as mentioned above may also be used. Thermal oxidation, furthermore, is not the only possible method for producing the elastic film 51; sputtering, CVD, spin coating, etc., may also be used.

Figure 6:
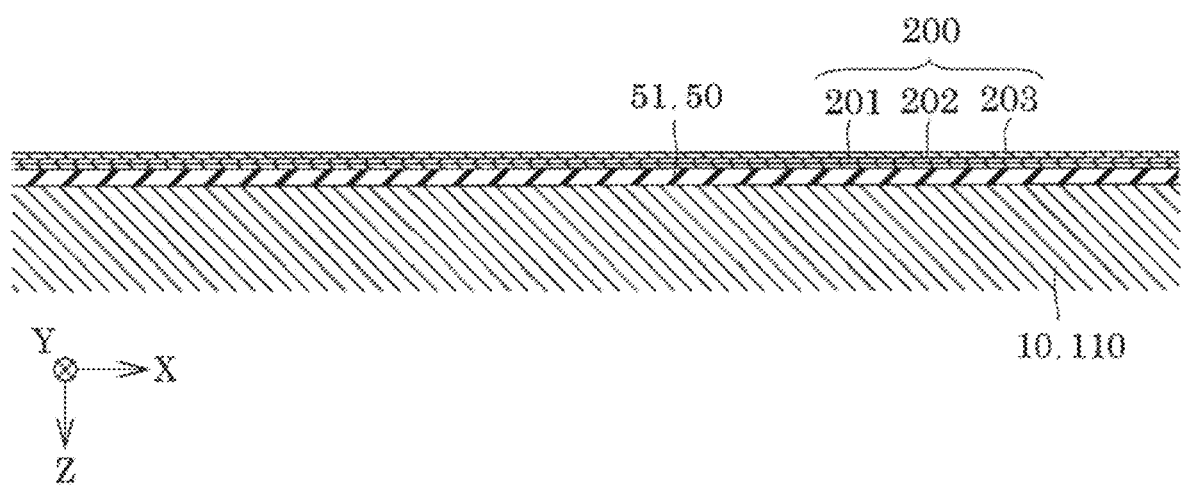
FIG. 6 is a cross-sectional diagram illustrating a method for producing recording heads according to Embodiment 1.

Then, as illustrated in FIG. 6, an orientation layer 200 is formed on the elastic film 51. The orientation layer 200 only needs to be formed by stacking two or more tiers. In this embodiment, the orientation layer 200 is formed by stacking first, second, and third tiers 201, 202, and 203. As stated, these first, second, and third tiers 201, 202, and 203 of the orientation layer 200 can be made of any material(s) that carries out self-assembly in the (100) plane. For example, the tiers contain at least one selected from $LaNi_yO_x$ (abbreviated to LNO), $SrRu_yO_x$ (SRO), $(Ba,Sr)Ti_yO_x$ (BST), and $(Bi,Fe)Ti_yO_x$ (BFT). For this to be achieved, it is only needed that each of the first, second, and third tiers 201, 202, and 203 contain at least one selected from LNO, SRO, BST, and BFT. When it is stated herein that each of first, second, and third tiers 201, 202, and 203 contains at least one selected from LNO, SRO, BST, and BFT, it means the percentage of the one or two or more selected from LNO, SRO, BST, and BFT in each tier is 50% by mass or more. The first, second, and third tiers 201, 202, and 203 may contain the same material(s) or may contain different materials. Preferably, each tier of the orientation layer 200 contains the same material(s). Forming each tier of the orientation layer 200 from the same material(s) eliminates the need for changing the material(s) from tier to tier, thereby helping reduce the cost and complexity of the production of the orientation layer 200. When it is stated herein that each tier of the orientation layer 200 contains the same material(s), it means the same element(s) is contained. That is, each tier of the orientation layer 200 in that case may vary in crystal structure and/or elemental composition as long as the same element(s) is used therein. When it is stated herein that each tier of the orientation layer 200 contains the same material(s), furthermore, it also includes the case in which each tier of the orientation layer 200 is produced from the same raw material(s). In this embodiment, the raw material for the formation of the tiers of the orientation layer 200 is, for example, $LaNiO_3$, $LaNi_yO_x$ where $x=3$ and $y=1$.

Configured as such, the orientation layer 200 can be formed by a gas-phase film formation process (also abbreviated to a gas-phase process), such as sputtering, physical vapor deposition (PVD), or laser ablation, or a liquid phase film formation method (also abbreviated to a liquid phase method), such as MOD or the sol-gel process. In this embodiment, each of the first, second, and third tiers 201, 202, and 203 of the orientation layer 200 is formed by a liquid phase method.

To be more exact, lanthanum acetylacetonate, nickel acetylacetonate, acetic acid, and water are mixed together to give a mixture in the form of solution, and this mixture is heated. Omitting water or acetic acid will cause the lanthanum and nickel acetylacetonates to remain undissolved, thereby affecting the stability of the mixture. It is not critical how to prepare the mixture. For example, mixing predetermined amounts of lanthanum and nickel acetylacetonates together and then adding acetic acid and water gives the mixture. It is not critical how to mix in the acetic acid and water either. The water may be added after the acetic acid, the acetic acid may be added after the water, or the acetic acid and water may be mixed together before addition. In this embodiment, lanthanum and nickel acetylacetonates are dissolved in a mixture of acetic acid and water, and the resulting solution is heated to give a precursor. This precursor solution is applied to the substrate by spin coating at 500 to 3000 rpm (application step). Then the solution applied to the substrate is dried for approximately 10 minutes by heating to 100° C. to 250° C. to give a dry film (drying step). Then this dry film is degreased by heating the film to 300° C. to 500° C. and maintaining it at that temperature for approximately 10 minutes (degreasing step). The term degreasing here means eliminating organic components from the dry film by converting them into $NO_2$, $CO_2$, $H_2O$, etc. After this degreasing step, the degreased dry film is fired by heating the film to 500° C. to 800° C. and maintaining it at that temperature for approximately 10 minutes (firing step). The first, second, and third tiers 201, 202, and 203 are formed by repeating these application to firing steps from tier to tier. That is, each of the first, second, and third tiers 201, 202, and 203 of the orientation layer 200 is formed through a process involving firing. Since the formation of each tier involves thermal insulation, an interface is formed between the first and second tiers 201 and 202 and between the second and third tiers 202 and 203. By virtue of the use of an liquid phase film formation method, furthermore, the resulting tiers of the orientation layer 200 are relatively thin, 10 nm or less per tier. Preferably, the total thickness, in the +Z direction, of the orientation layer 200 is 5 nm or more and 20 nm or less. When formed relatively thin like that, the orientation layer 200 will not easily interfere with the displacement of the piezoelectric actuators 300. The piezoelectric actuators 300 will therefore be improved in terms of displacement characteristics, or achieve a large displacement with a relatively low voltage.

Forming the orientation layer 200 by stacking two or more tiers, the three tiers of first, second, and third tiers 201, 202, and 203 in this embodiment, ensures the second and third tiers 202 and 203 will be (100) preferentially oriented through self-assembly with limited influence of the underlying diaphragm 50.

Figure 7:
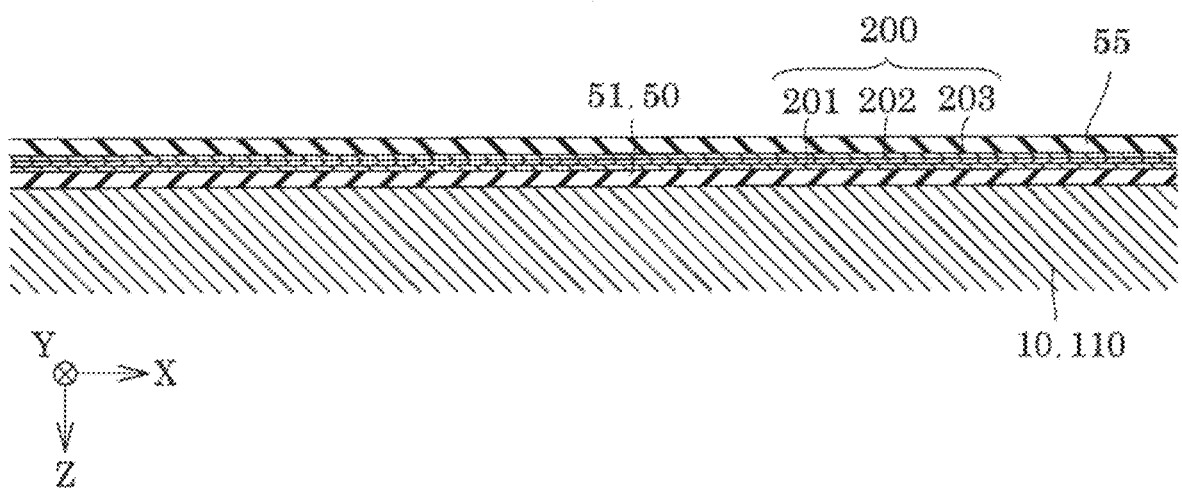
FIG. 7 is a cross-sectional diagram illustrating a method for producing recording heads according to Embodiment 1.

Then, as illustrated in FIG. 7, a zirconium oxide insulating film 55 is formed on the orientation layer 200. Naturally, zirconium oxide is not the only possible material for the insulating film 55; silicon nitride ($Si_3N_4$), titanium oxide ($TiO_2$), aluminum oxide ($Al_2O_3$), hafnium oxide ($HfO_2$), magnesium oxide (MgO), lanthanum aluminate ($LaAlO_3$), etc., may also be used. Examples of methods for the formation of the insulating film 55 include sputtering, CVD, and other deposition processes. Formed on the orientation layer 200, the insulating film 55 will be (110) preferentially oriented as a result of lattice matching with the (100) plane of the orientation layer 200.

Figure 8:
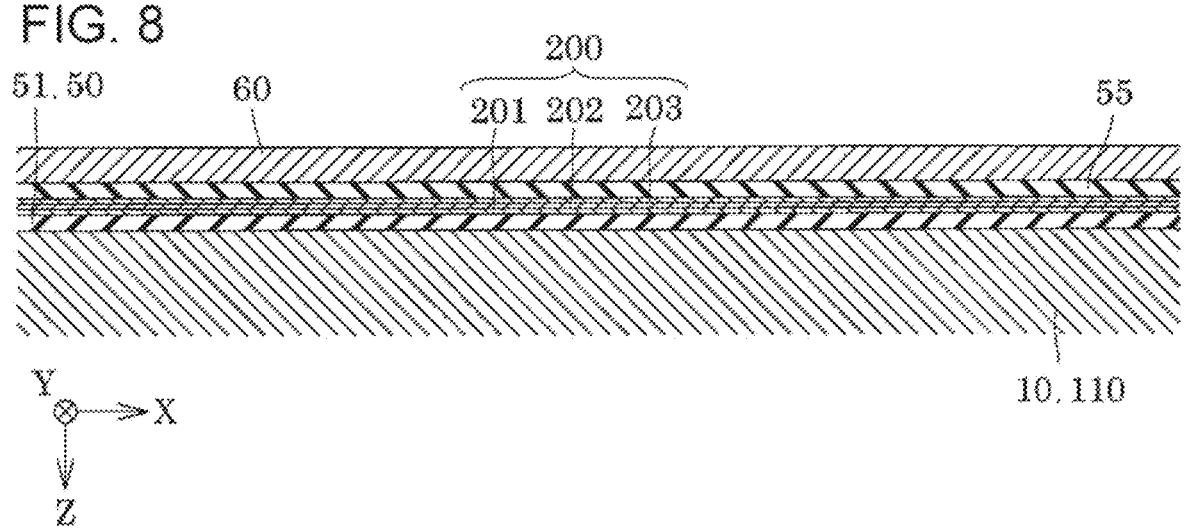
FIG. 8 is a cross-sectional diagram illustrating a method for producing recording heads according to Embodiment 1.

Then, as illustrated in FIG. 8, a first electrode 60 is formed to cover the entire surface of the insulating film 55. The material for this first electrode 60 is not critical, but when the piezoelectric layer 70 is a layer of lead zirconate titanate (PZT), it is desirable that the material be not prone to change its electrical conductivity because of diffusion of lead oxide thereinto. Materials like platinum and iridium are therefore suitable for the first electrode 60. The method for the formation of the first electrode 60 can be, for example, sputtering or PVD (physical vapor deposition). Formed on the insulating film 55, the first electrode 60 will be (100) preferentially oriented as a result of lattice matching with the (110) plane of the insulating film 55.

In this embodiment, a lead zirconate titanate (PZT) piezoelectric layer 70 is formed next. The piezoelectric layer 70 in this embodiment is formed using the process called the sol-gel process, in which a metal complex is dissolved or dispersed in a solvent, the resulting "sol" is applied and dried, and the resulting gel is fired at high temperatures to give a metal oxide piezoelectric layer 70. The sol-gel process is not the only possible method for the formation of the piezoelectric layer 70; other liquid phase film formation method, such as MOD, and gas-phase film formation processes, such as sputtering, physical vapor deposition (PVD), and laser ablation, may also be used.

Figure 9:
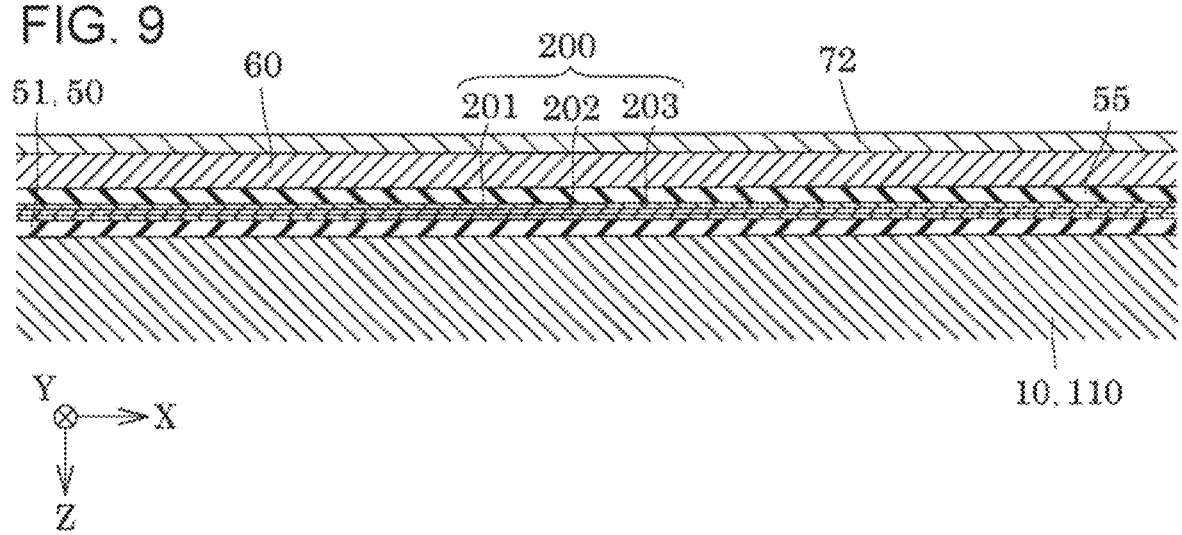
FIG. 9 is a cross-sectional diagram illustrating a method for producing recording heads according to Embodiment 1.

To describe the specific procedure for the formation of the piezoelectric layer 70, a piezoelectric precursor film 72 that is a PZT precursor film is formed on the first electrode 60 and the insulating film 55 first, as illustrated in FIG. 9. That is, a sol (solution) containing the metal complex is applied to the flow-channel substrate wafer 110 with the first electrode 60 thereon (application step). Then this piezoelectric precursor film 72 is dried for a certain period of time by heating to a predetermined temperature (drying step). For example, in this embodiment, the piezoelectric precursor film 72 can be dried by maintaining it at 170° C. to 180° C. for 8 to 30 minutes.

Then the dried piezoelectric precursor film 72 is degreased by heating the film to a predetermined temperature and maintaining it at that temperature for a certain period of time (degreasing step). For example, in this embodiment, the piezoelectric precursor film 72 is dried by heating the film to a temperature of approximately 300° C. to 400° C. and maintaining it at that temperature for approximately 10 to 30 minutes. The term degreasing here means eliminating organic components from the piezoelectric precursor film 72 by converting them into $NO_2$, $CO_2$, $H_2O$, etc.

Figure 10:
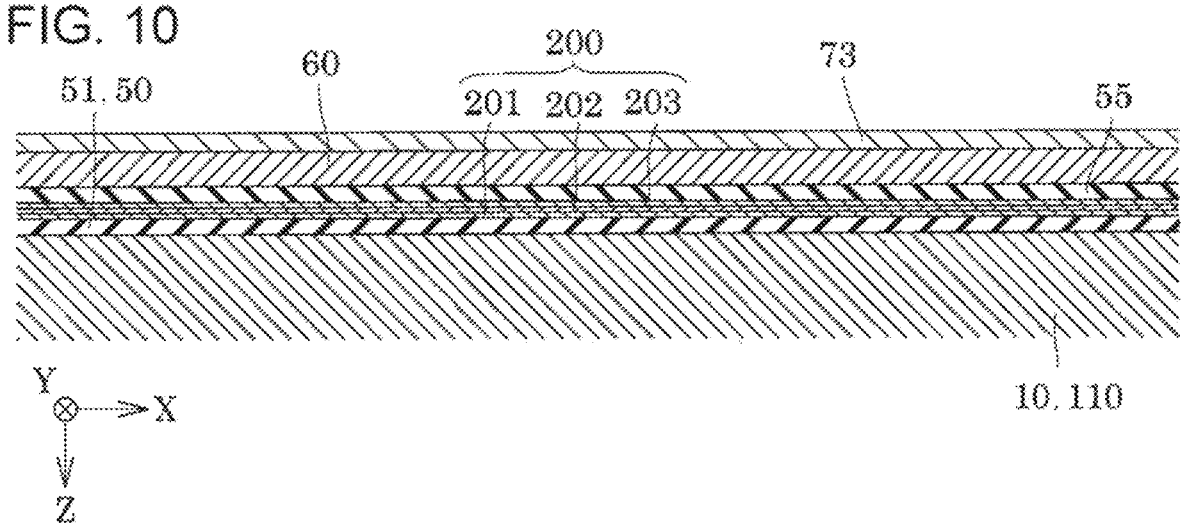
FIG. 10 is a cross-sectional diagram illustrating a method for producing recording heads according to Embodiment 1.

Then, as illustrated in FIG. 10, the piezoelectric precursor film 72 is heated to a predetermined temperature and maintained at that temperature for a certain period of time so that the film will crystallize into piezoelectric film 73 (firing step). Preferably, in this firing step, the piezoelectric precursor film 72 is heated to 700° C. or above. In the firing step, furthermore, it is preferred that the rate of temperature elevation be 50° C./sec or more. This ensures piezoelectric film 73 with superior characteristics will be obtained. The heater used in the drying, degreasing, and firing steps can be, for example, a hot plate or an RTP (rapid thermal processing) system, which provides heating through irradiation with an infrared lamp.

Figure 11:
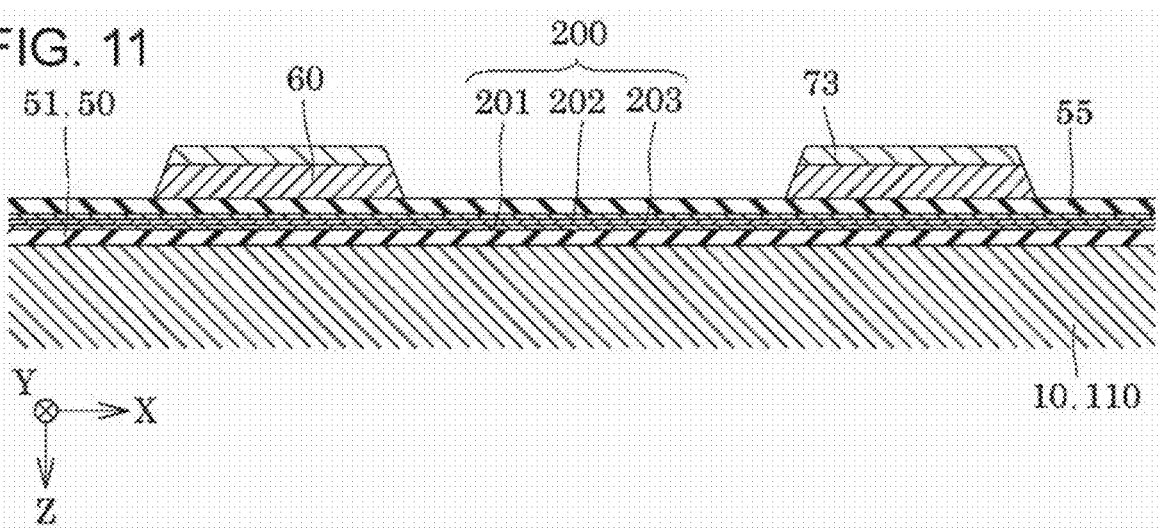
FIG. 11 is a cross-sectional diagram illustrating a method for producing recording heads according to Embodiment 1.

Then, as illustrated in FIG. 11, with this first layer of piezoelectric film 73 on the first electrode 60, the first electrode 60 and the first layer of piezoelectric film 73 are patterned together. The patterning of the first electrode 60 and the first layer of piezoelectric film 73 can be carried out by, for example, dry etching, such as ion milling.

When the first electrode 60 is patterned before the formation of the first layer of piezoelectric film 73, for example, the crystallinity of the resulting piezoelectric film 73 would be unsatisfactory; the patterning of the first electrode 60 involves photolithography, ion milling, and ashing, and, therefore, the first layer of piezoelectric film 73 would be formed on an altered surface of the first electrode 60. In the second and subsequent layers of piezoelectric film 73, the growth of crystals would be likewise influenced by the state of crystallization of the first layer of piezoelectric film 73. Overall, the entire piezoelectric layer 70 would be unsatisfactory in terms of crystallinity.

When the first layer of piezoelectric film 73 is formed first and then patterned together with the first electrode 60, by contrast, the influence of the patterning on the growth of crystals in the second and subsequent layers of piezoelectric film 73 is insignificant. Although the patterning may form a very thin altered layer on its surface, the first layer of piezoelectric film 73 behaves as potent seeds for crystals to grow well in the second and subsequent layers of piezoelectric film 73, for example compared with the first electrode 60.

Figure 12:
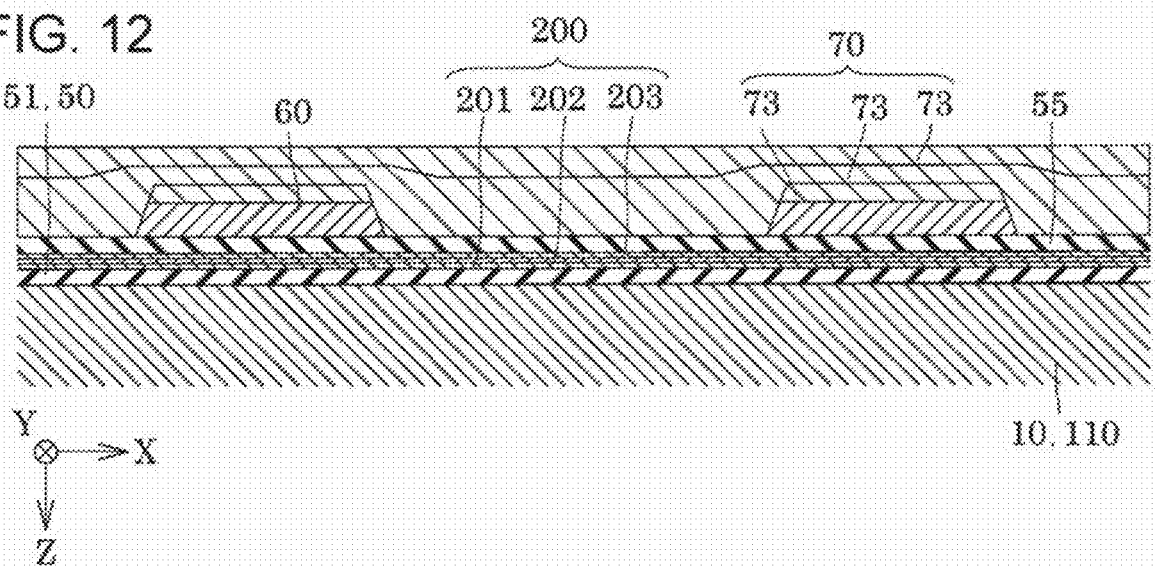
FIG. 12 is a cross-sectional diagram illustrating a method for producing recording heads according to Embodiment 1.

Then, as illustrated in FIG. 12, a piezoelectric layer 70 composed of multiple layers of piezoelectric film 73 is formed by repeating the application, drying, degreasing, and firing steps.

In this embodiment, the first layer of piezoelectric film 73 is formed on a (100) preferentially oriented first electrode 60 without a crystal seed layer, for example of titanium (Ti), for faster crystallization of the piezoelectric film 73. Even though, the piezoelectric layer 70 formed on the first electrode 60 is (100) preferentially oriented because the first electrode 60 is (100) preferentially oriented by virtue of the presence of the orientation layer 200.

After the patterning of the first electrode 60 and the first layer of piezoelectric film 73, the inventors believe, second and subsequent layers of piezoelectric film 73 can be formed on the insulating film 55 without crystal seed layers on the insulating film 55, or "intermediate" seed layers, because the insulating film 55 is (110) preferentially oriented. The intermediate seed layers, when present, would function as seeds that facilitate the crystallization of the piezoelectric film 73. After the firing of the piezoelectric film 73, some part of them would diffuse into the piezoelectric film 73, but another part would be left on the insulating film 55 as a result of thermal oxidation. An intermediate seed layer left on the insulating film 55 would have only a low dielectric constant; therefore, any intermediate seed layer formed between the insulating film 55 and the piezoelectric layer 70 would affect the effective electric field applied to the active portions 310 of the piezoelectric layer 70. In this embodiment, no initial or intermediate crystal seed layer is required. Between the insulating film 55 and the piezoelectric layer 70, therefore, no low-dielectric layer is formed that would affect the effective electric field applied to the active portions 310. The associated decrease in the displacement of the piezoelectric actuators 300 is prevented in consequence.

It should be noted that the first electrode 60 and the first layer of piezoelectric film 73 in this embodiment are patterned together, but this is not essential. The first electrode 60 may be patterned first, and then the first layer of piezoelectric film 73 may be formed to cover the insulating film 55 and the first electrode 60. Even when the first layer of piezoelectric film 73 is formed after the patterning of the first electrode 60, the piezoelectric film 73 will be (100) preferentially oriented through lattice matching with the insulating film 55 and the first electrode 60 as described above.

Figure 13:
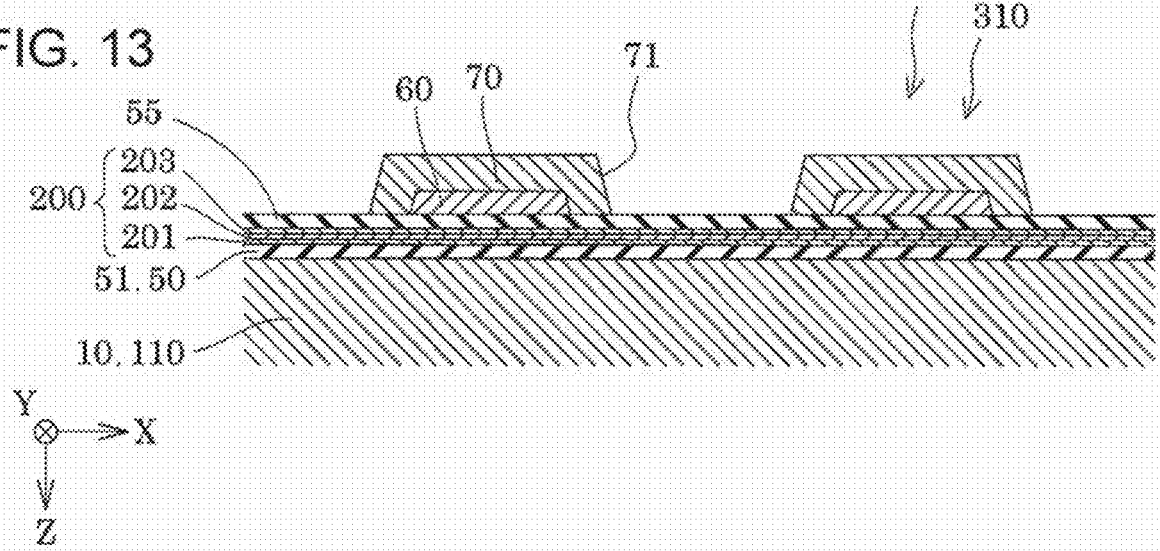
FIG. 13 is a cross-sectional diagram illustrating a method for producing recording heads according to Embodiment 1.

Then, as illustrated in FIG. 13, the piezoelectric layer 70 is patterned into a set of regions facing the pressure chambers 12. In this embodiment, the patterning is carried out by the process called photolithography, in which the piezoelectric layer 70 is etched with a mask in a predetermined shape (not illustrated) thereon. An example of a method for patterning the piezoelectric layer 70 is dry etching, such as reactive ion etching or ion milling. This patterning of the piezoelectric layer 70 creates recesses 71.

Figure 14:
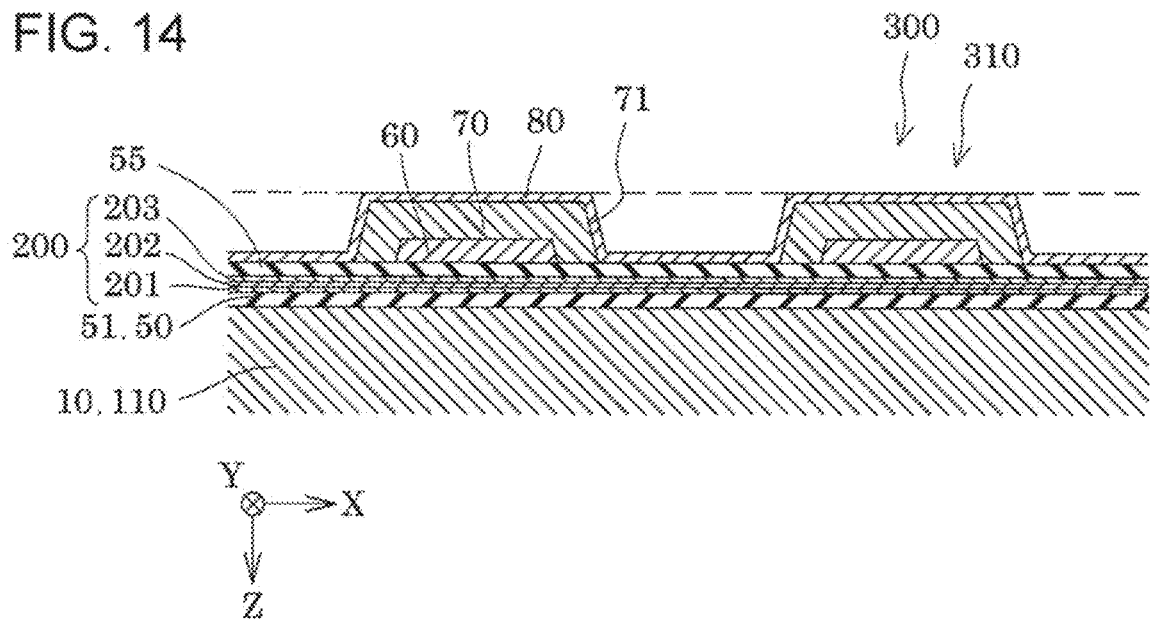
FIG. 14 is a cross-sectional diagram illustrating a method for producing recording heads according to Embodiment 1.

Then, as illustrated in FIG. 14, a second electrode 80 is formed to cover the piezoelectric layer 70 and the insulating film 55 and patterned into a predetermined shape, giving piezoelectric actuators 300. Then, although not illustrated, separate and common lead electrodes 91 and 92 are formed on the flow-channel substrate wafer 110.

Figure 15:
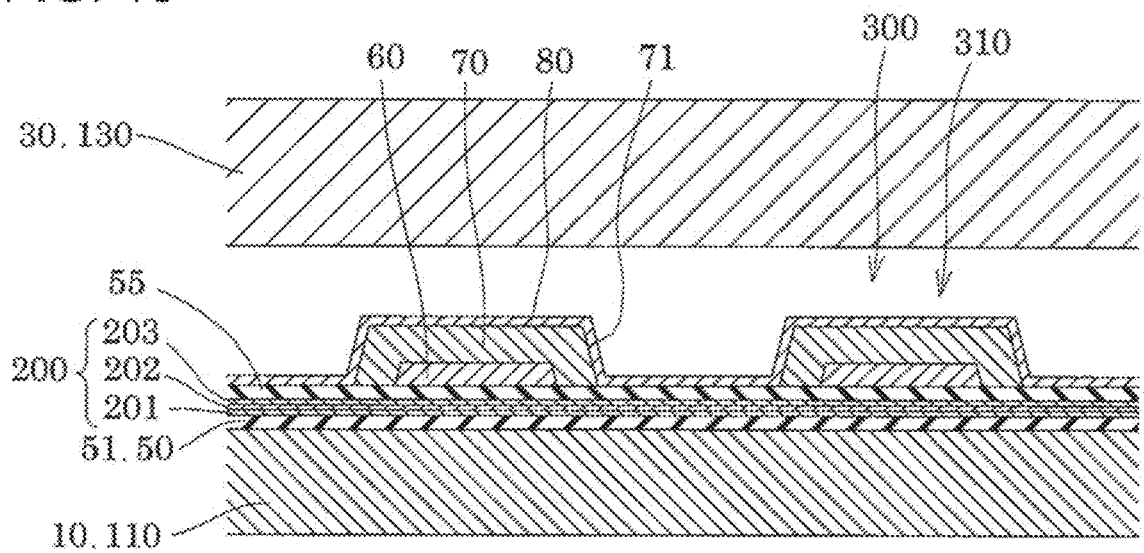
FIG. 15 is a cross-sectional diagram illustrating a method for producing recording heads according to Embodiment 1.

Then, as illustrated in FIG. 15, a protecting-substrate wafer 130, which is a silicon wafer that will be cut into multiple protective substrates 30, is bonded to the piezoelectric actuator 300 side of the flow-channel substrate wafer 110, and then the flow-channel substrate wafer 110 is thinned to a predetermined thickness. The protecting-substrate wafer 130 has retaining portions 31 (see FIG. 3) created beforehand.

Figure 16:
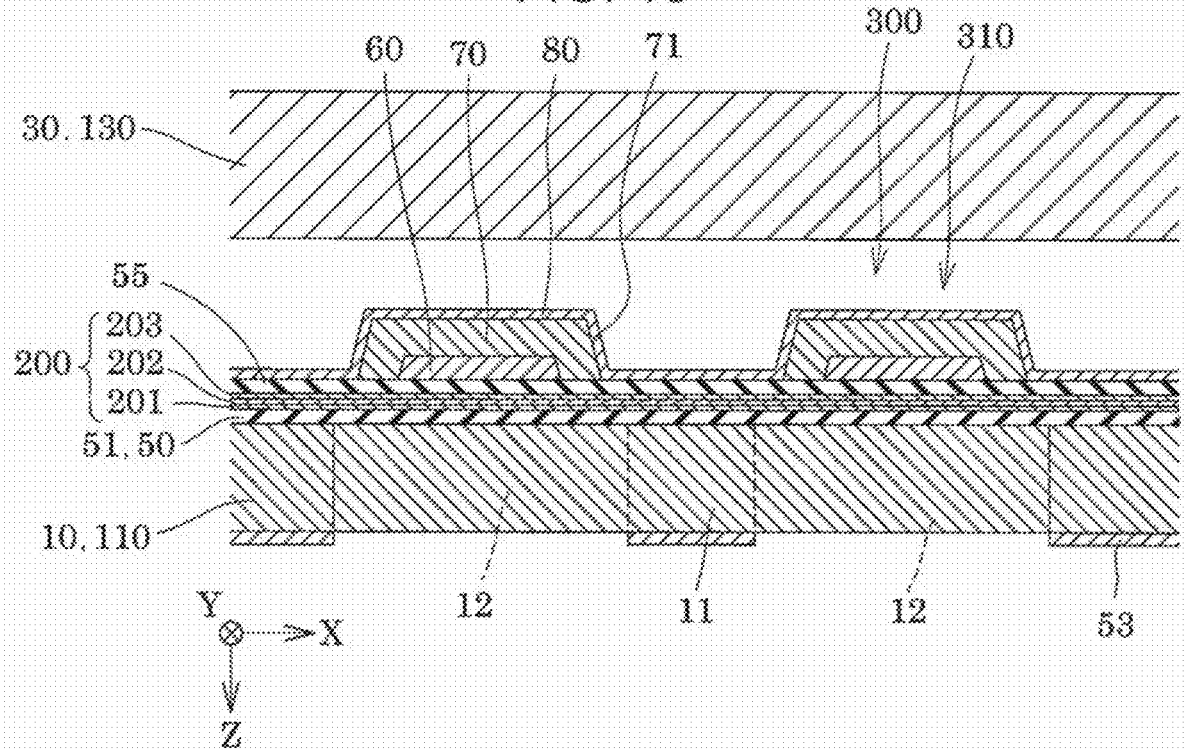
FIG. 16 is a cross-sectional diagram illustrating a method for producing recording heads according to Embodiment 1.
Figure 17:
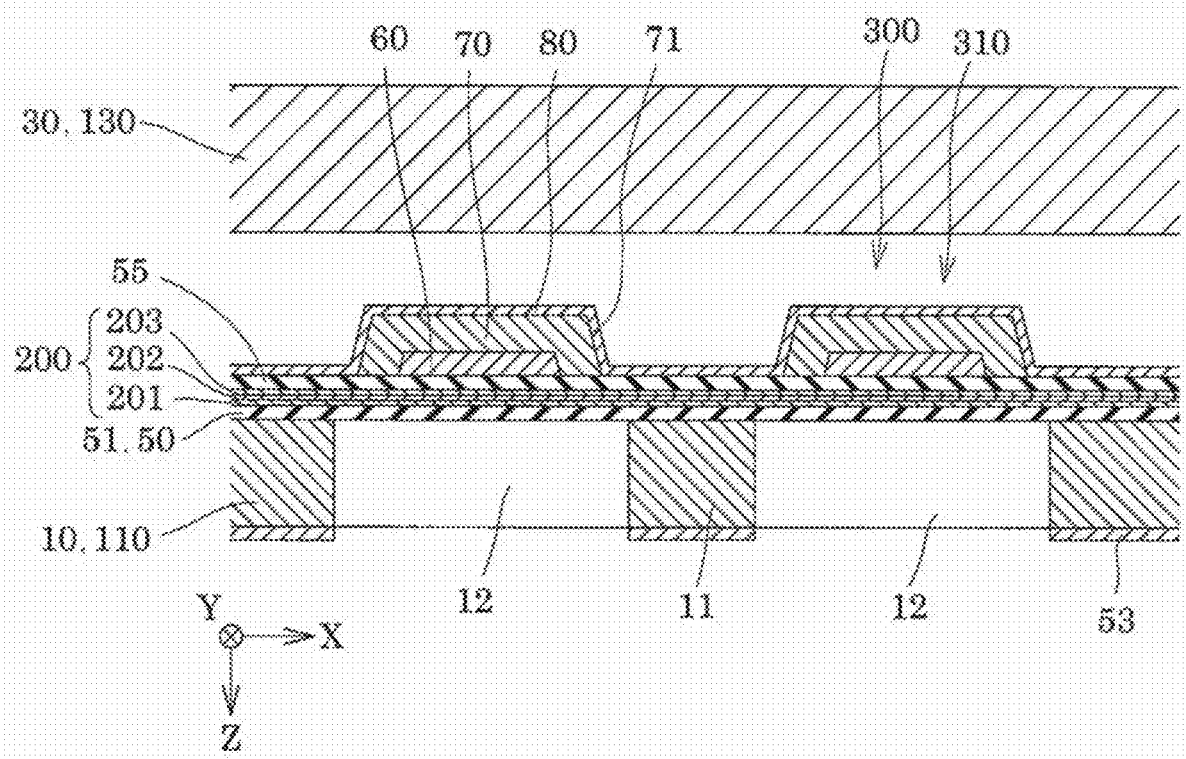
FIG. 17 is a cross-sectional diagram illustrating a method for producing recording heads according to Embodiment 1.

Then, as illustrated in FIG. 16, a new mask film 53 is formed on the flow-channel substrate wafer 110 and patterned into a predetermined shape. Then, as illustrated in FIG. 17, the flow-channel substrate wafer 110 is anisotropically etched with the mask film 53 thereon using a KOH or other alkali solution (wet etching), creating pressure chambers 12 divided by partitions 11.

After that, the unnecessary margins of the flow-channel substrate and protecting-substrate wafers 110 and 130 are removed by cutting them, for example by dicing. The bonded stack of flow-channel substrate and protecting-substrate wafers 110 and 130 is then cut into flow-channel substrates 10, etc., of one-chip size like as illustrated in FIG. 1. After that, an interconnecting sheet 15, a nozzle plate 20, a casing 40, a compliant substrate 45, and other components are bonded to the bonded stacks of protecting and flow-channel substrates 30 and 10, completing recording heads 1 according to this embodiment.

Test Example 1

A silicon dioxide ($SiO_2$) elastic film 51 was formed by thermally oxidizing a silicon monocrystalline substrate. On this elastic film 51, four tiers of LNO were stacked by a liquid phase method as described above to form an orientation layer 200. After that, a PZT piezoelectric layer 70 was formed on the orientation layer 200. The method for the formation of the piezoelectric layer 70 was as described in Embodiment 1. Each of the four tiers of the orientation layer 200 was analyzed by X-ray diffraction (XRD), using Bruker AXS's "D8 Discover." The measurement was carried out using a CuKα radiation source and a two-dimensional detector (GADDS) at room temperature, with X-rays emitted vertically, or in the +Z direction, into each tier. The measured X-ray diffraction patterns are presented in FIGS. 18 to 21.

Figure 18:
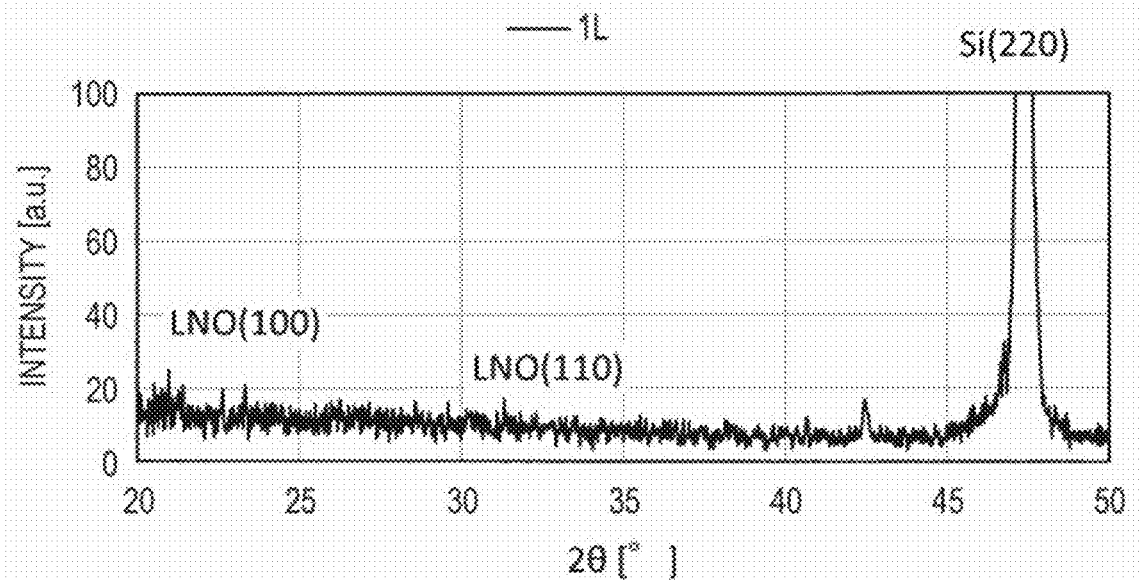
FIG. 18 is an X-ray diffraction pattern obtained in Test Example 1.

As shown in FIG. 18, the first tier of LNO had no preferred orientation; no peak was observed corresponding to (100) and (110) orientations of LNO.

Figure 19:
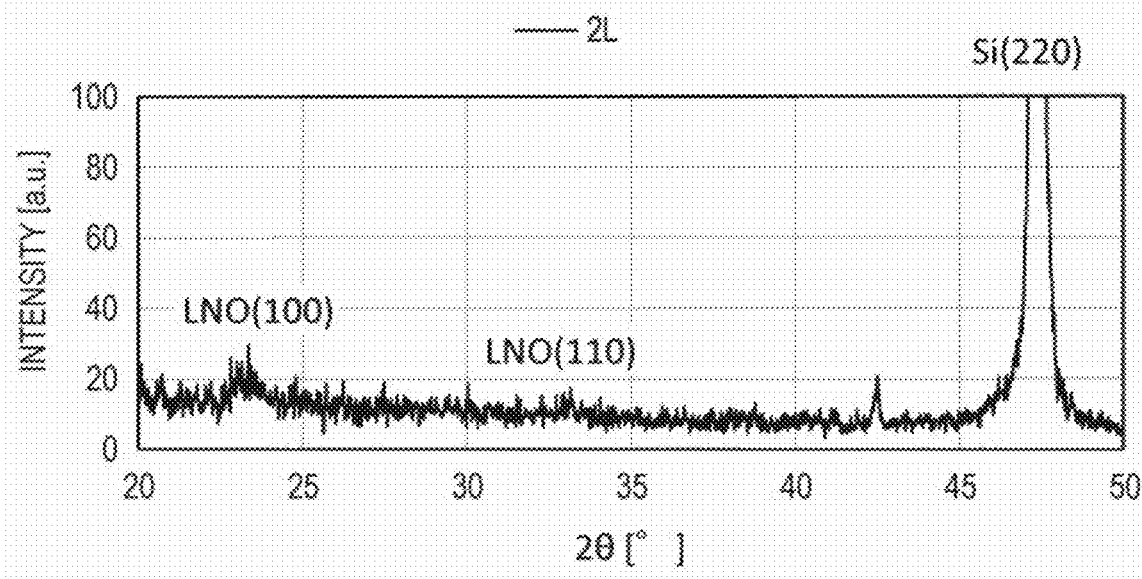
FIG. 19 is an X-ray diffraction pattern obtained in Test Example 1.

As shown in FIG. 19, the second tier of LNO was (100) preferentially oriented; peaks were observed corresponding to (100) and (110) orientations of LNO at 2θ of around 23° and 33°, respectively, with the (100) orientation peak more intense.

As shown in FIG. 20, the third tier of LNO was (100) preferentially oriented; peaks were observed corresponding to (100) and (110) orientations of LNO at 2θ of around 23° and 33°, respectively, with the (100) orientation peak more intense. The degree of (100) orientation, furthermore, was higher in the third tier of LNO than in the second tier; in the XRD of the third tier of LNO, the (100) orientation peak was more intense than in that of the second tier.

As shown in FIG. 21, for the fourth tier of LNO, peaks were observed corresponding to (100) and (110) orientations of LNO at 2θ of around 23° and 33°, respectively. The degree of orientation, furthermore, of the fourth tier of LNO was comparable to that of the third tier.

Overall, when forming an orientation layer 200 on a $SiO_2$ elastic film 51, doing so by stacking two or more tiers ensures the uppermost tier of the orientation layer 200 will be (100) preferentially oriented. When the orientation layer 200 is formed by stacking three or more tiers, furthermore, the uppermost tier is (100) preferentially oriented with a higher degree of orientation.

Test Example 2

Through the same process as in Test Example 1, a three-tiered LNO orientation layer 200 was formed on a silicon dioxide ($SiO_2$) elastic film 51. A PZT piezoelectric layer 70 was formed on the orientation layer 200. The method for the formation of the piezoelectric layer 70 was as described in Embodiment 1. A vertical section of each of the stacked film and layers was observed using a transmission electron microscope (TEM). The TEM image of the elastic film 51, orientation layer 200, and piezoelectric layer 70 is presented in FIG. 22.

Figure 22:
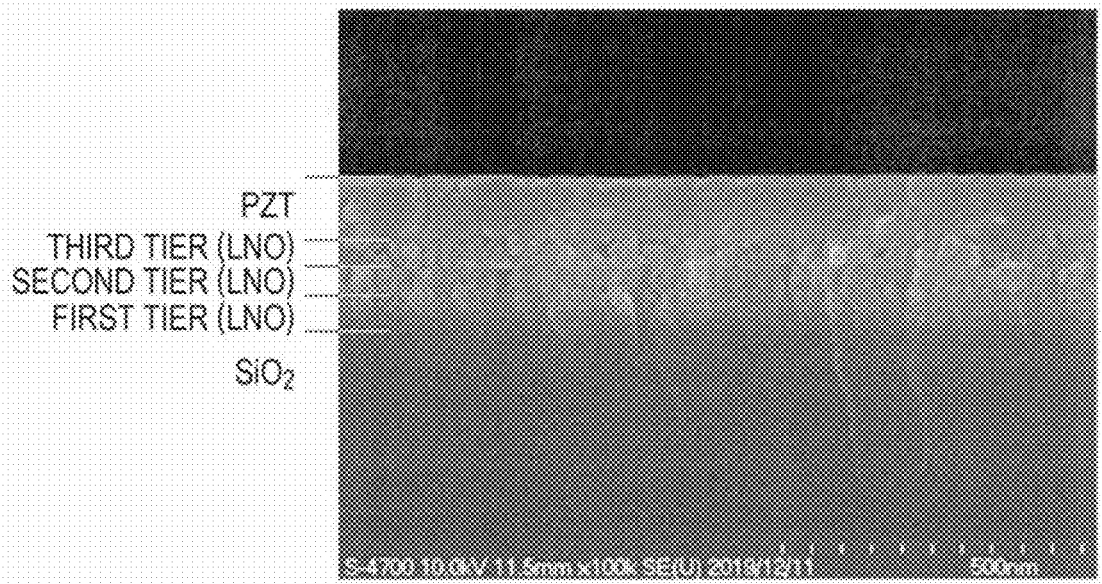
FIG. 22 is a TEM image obtained in Test Example 2.

The TEM image in FIG. 22 revealed that the crystal structure was broken at the boundaries between the first, second, and third tiers of LNO, creating an interface. In the first tier of LNO no columnar crystals were observed, indicating this tier had no preferred orientation. In the second and third tiers of LNO columnar crystals were observed, indicating these tiers had a preferred orientation. By virtue of the orientation layer 200 being a stack of two or more tiers, therefore, the first tier of LNO serves as a sacrificial layer that terminates the underlying amorphous elastic film 51, allowing the second and subsequent tiers of LNO to carry out self-assembly. That is, forming an orientation layer 200 by stacking two or more tiers having a strong tendency toward self-assembly ensures the uppermost tier of the orientation layer 200 will be (100) preferentially oriented as a result of self-assembly. In that case, therefore, it is easy to form a (100) preferentially oriented piezoelectric layer 70 on or above an orientation layer 200 formed on a silicon dioxide ($SiO_2$) elastic film 51. With such an orientation layer 200, the piezoelectric layer 70 can be formed without a crystal seed layer, for example of titanium (Ti), for faster crystallization of the piezoelectric layer 70 on the first electrode 60 and the insulating film 55. The crystal seed layer, when present, would function as seeds that facilitate the crystallization of the piezoelectric layer 70. After the firing of the piezoelectric layer 70, some part of it would diffuse into the piezoelectric layer 70, but another part would be left on the first electrode 60 and the insulating film 55 as a result of thermal oxidation. A crystal seed layer left on the first electrode 60 and the insulating film 55 would have only a low dielectric constant; therefore, any crystal seed layer formed not only between the first electrode 60 and the piezoelectric layer 70 but also between the insulating film 55 and the piezoelectric layer 70 would affect the effective electric field applied to the active portions 310 of the piezoelectric layer 70. In this embodiment, no crystal seed layer is required. Between the insulating film 55 and the piezoelectric layer 70, therefore, no low-dielectric layer is formed that would affect the effective electric field applied to the active portions 310. The associated decrease in the displacement of the piezoelectric actuators 300 is prevented in consequence.

Overall, an ink jet recording head 1, an example of a piezoelectric device, according to this embodiment includes a diaphragm 50; a piezoelectric actuator 300 having a first electrode 60, a piezoelectric layer 70, and a second electrode 80, the first electrode 60 being on the diaphragm 50; and an orientation layer 200 between the diaphragm 50 and the piezoelectric layer 70, the orientation layer 200 being a stack of two or more tiers. In this embodiment, the orientation layer 200 is a stack of first, second, and third tiers 201, 202, and 203.

By virtue of the presence of a multi-tiered orientation layer 200 between the diaphragm 50 and the orientation layer 70, the lowermost tier, on the diaphragm 50 side, of the orientation layer 200 functions as a sacrificial layer that limits the influence of the underlying diaphragm 50. The uppermost tier, which is on or above the lowermost tier, achieves a preferred orientation through self-assembly with limited influence of the underlying diaphragm 50. On or above this orientation layer 200 with a preferred orientation, the piezoelectric layer 70 is orientationally controlled.

Preferably, the orientation layer 200 in the recording head 1 according to this embodiment is a stack of tiers containing the same material(s). Using the same material(s) in each tier of the orientation layer 200 ensures the tiers will have equal lattice constants and therefore will be matched in lattice structure, thereby helping improve the degree of orientation of the uppermost tier, which is on the piezoelectric layer 70 side, of the orientation layer 200. Making each tier of the orientation layer 200 with the same material(s) also simplifies the production process, thereby helping reduce the cost.

Preferably, the diaphragm 50 in the recording head 1 according to this embodiment contains silicon oxide. Even with an amorphous diaphragm 50, the lowermost tier, which is on the diaphragm 50 side, of the multi-tiered orientation layer 200 functions as a buffer layer, and the uppermost tier achieves a preferred orientation through self-assembly.

Preferably, the orientation layer 200 in the recording head 1 according to this embodiment contains at least one selected from $LaNi_yO_x$, $SrRu_yO_x$, $(Ba,Sr)Ti_yO_x$, and $(Bi,Fe)Ti_yO_x$. Using material(s) having a strong tendency toward self-assembly as material(s) for the orientation layer 200 helps the uppermost tier of the orientation layer 200 achieve a preferred orientation. Using any of these materials as material(s) for the orientation layer 200 also ensures the piezoelectric layer 70, which is on or above the orientation layer 200, is (100) preferentially oriented.

Preferably, the orientation layer 200 in the recording head 1 according to this embodiment is made of $LaNi_yO_x$. Using LNO, which has a strong tendency toward self-assembly, as the material for the orientation layer 200 helps increase the degree of orientation of the uppermost tier of the multi-tiered orientation layer 200. With LNO, therefore, the orientation layer 200 has an increased degree of orientation, which improves the degree of orientation of the piezoelectric layer 70, which is on or above the orientation layer 200. As a result, the displacement of the piezoelectric layer 70 becomes more efficient.

Preferably, the orientation layer 200 in the recording head 1 according to this embodiment has a (100) preferentially oriented tier on the piezoelectric layer 70 side. A (100) preferentially oriented tier on the piezoelectric layer 70 side of the orientation layer 200 ensures the piezoelectric layer 70, which is on or above the orientation layer 200, is (100) preferentially oriented. The piezoelectric layer 70 in this case, therefore, has a relatively large piezoelectric constant d31.

Preferably, the orientation layer 200 in the recording head 1 according to this embodiment is a stack of three or more tiers. Making the orientation layer 200 as a stack of three or more tiers leads to an improved degree of orientation of the uppermost tier, which is on the piezoelectric layer 70 side, of the orientation layer 200, thereby helping improve the degree of orientation of the piezoelectric layer 70, which is on or above the orientation layer 200. The piezoelectric layer 70 in this case, therefore, has a relatively large piezoelectric constant d31.

Preferably, each tier of the orientation layer 200 in the recording head 1 according to this embodiment has a thickness of 10 nm or less. When formed by 10 nm or thinner tiers, the orientation layer 200 does not easily interfere with the displacement of the piezoelectric actuator 300. The piezoelectric actuator 300 is therefore superior in displacement characteristics, or achieves a large displacement with a low voltage.

Preferably, the recording head 1 according to this embodiment includes an insulating film 55 between the orientation layer 200 and the piezoelectric layer 70, the insulating film 55 being a layer containing zirconium oxide. An insulating film 55 containing zirconium oxide between the orientation layer 200 and the piezoelectric layer 70 helps prevent constituents of the piezoelectric layer 70 from diffusing to the diaphragm 50 side across the insulating film 55 and also helps prevent constituents of the orientation layer 200 from diffusing to the piezoelectric layer 70 side across the insulating film 55. With such an insulating film 55, therefore, the possibility of unevenness in the composition of the piezoelectric layer 70 in the +Z direction is lowered, and the displacement characteristics of the piezoelectric layer 70 are improved in consequence.

A method according to this embodiment for producing an ink jet recording head 1, an example of a piezoelectric device, is for producing an ink jet recording head 1 that includes a diaphragm 50; a piezoelectric actuator 300 having a first electrode 60, a piezoelectric layer 70, and a second electrode 80, the first electrode 60 being on the diaphragm 50; and an orientation layer 200 between the diaphragm 50 and the piezoelectric layer 70, the orientation layer 200 being a stack of two or more tiers. The method includes forming each tier of the orientation layer 200 by a liquid phase method. An orientation layer 200 produced by forming its tiers by a liquid phase method is relatively thin. Since a multi-tiered orientation layer 200 is formed between the diaphragm 50 and the piezoelectric layer 70, furthermore, the lowermost tier, which is on the diaphragm 50 side, of the orientation layer 200 functions as a sacrificial layer that limits the influence of the underlying diaphragm 50. The uppermost tier, formed on or above the lowermost tier, therefore achieves a preferred orientation through self-assembly with limited influence of the underlying diaphragm 50. On or above this orientation layer 200 with preferred orientation, the piezoelectric layer 70 can be formed with controlled orientation.

Preferably, in the method according to this embodiment for producing a recording head 1, the orientation layer 200 is formed by stacking tiers containing the same materials. Using the same material(s) in each tier of the orientation layer 200 ensures the tiers will have equal lattice constants and therefore will be matched in lattice structure, thereby helping improve the degree of orientation of the uppermost tier, which is on the piezoelectric layer 70 side, of the orientation layer 200. Forming each tier of the orientation layer 200 from the same material(s) also simplifies the production process, thereby helping reduce the cost.

Preferably, in the method according to this embodiment for producing a recording head 1, the diaphragm 50 contains silicon oxide. Even with an amorphous diaphragm 50, the lowermost tier, which is on the diaphragm 50 side, of the multi-tiered orientation layer 200 functions as a buffer layer, and the uppermost tier achieves a preferred orientation through self-assembly.

Preferably, in the method according to this embodiment for producing a recording head 1, the orientation layer 200 contains at least one selected from $LaNi_yO_x$, $SrRu_yO_x$, $(Ba,Sr)Ti_yO_x$, and $(Bi,Fe)Ti_yO_x$. Using material(s) having a strong tendency toward self-assembly as material(s) for the orientation layer 200 helps the uppermost tier of the orientation layer 200 achieve a preferred orientation. Using any of these materials as material(s) for the orientation layer 200 also ensures the piezoelectric layer 70, formed on or above the orientation layer 200, will be (100) preferentially oriented.

Preferably, in the method according to this embodiment for producing a recording head 1, the orientation layer 200 is made of $LaNi_yO_x$. Using LNO, which has a strong tendency toward self-assembly, as the material for the orientation layer 200 helps the uppermost tier of the multi-tiered orientation layer 200 achieve a preferred orientation, through self-assembly, with a higher degree of orientation.

Preferably, in the method according to this embodiment for producing a recording head 1, the orientation layer 200 has a (100) preferentially oriented tier on the piezoelectric layer 70 side. A (100) preferentially oriented tier on the piezoelectric layer 70 side of the orientation layer 200 ensures the piezoelectric layer 70, formed on or above the orientation layer 200, will be (100) preferentially oriented. The piezoelectric layer 70 in this case, therefore, will have a relatively large piezoelectric constant d31.

Preferably, in the method according to this embodiment for producing a recording head 1, the orientation layer 200 is formed by stacking three or more tiers. Forming the orientation layer 200 by stacking three or more tiers leads to an improved degree of orientation of the uppermost tier, which is on the piezoelectric layer 70 side, of the orientation layer 200.

Preferably, in the method according to this embodiment for producing a recording head 1, each tier of the orientation layer 200 is formed to a thickness of 10 nm or less. When formed by stacking 10 nm or thinner tiers, the orientation layer 200 will not easily interfere with the displacement of the piezoelectric actuator 300. The piezoelectric actuator 300 will therefore be superior in displacement characteristics, or achieve a large displacement with a low voltage.

Preferably, the method according to this embodiment for producing a recording head 1 includes providing an insulating film 55 between the orientation layer 200 and the piezoelectric layer 70, the insulating film 55 being a layer containing zirconium oxide. Providing an insulating film 55 containing zirconium oxide between the orientation layer 200 and the piezoelectric layer 70 helps prevent constituents of the piezoelectric layer 70 from diffusing to the diaphragm 50 side across the insulating film 55 and also helps prevent constituents of the orientation layer 200 from diffusing to the piezoelectric layer 70 side across the insulating film 55. With such an insulating film 55, therefore, the possibility of unevenness in the composition of the piezoelectric layer 70 in the +Z direction will be lowered, and the displacement characteristics of the piezoelectric layer 70 will be improved in consequence.

Other Embodiments

The embodiment described above is not the only possible basic configuration of an aspect of the present disclosure.

Figure 23:
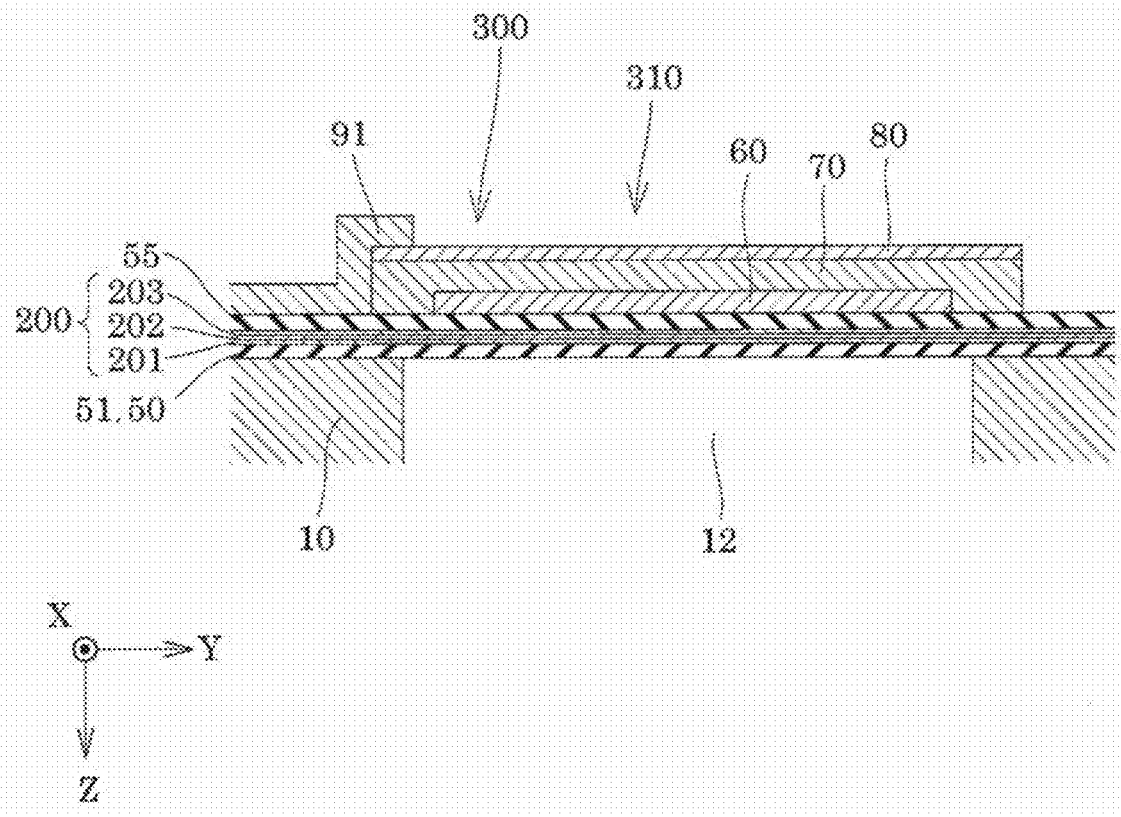
FIG. 23 is a cross-sectional diagram illustrating a variation of a piezoelectric actuator.
Figure 24:
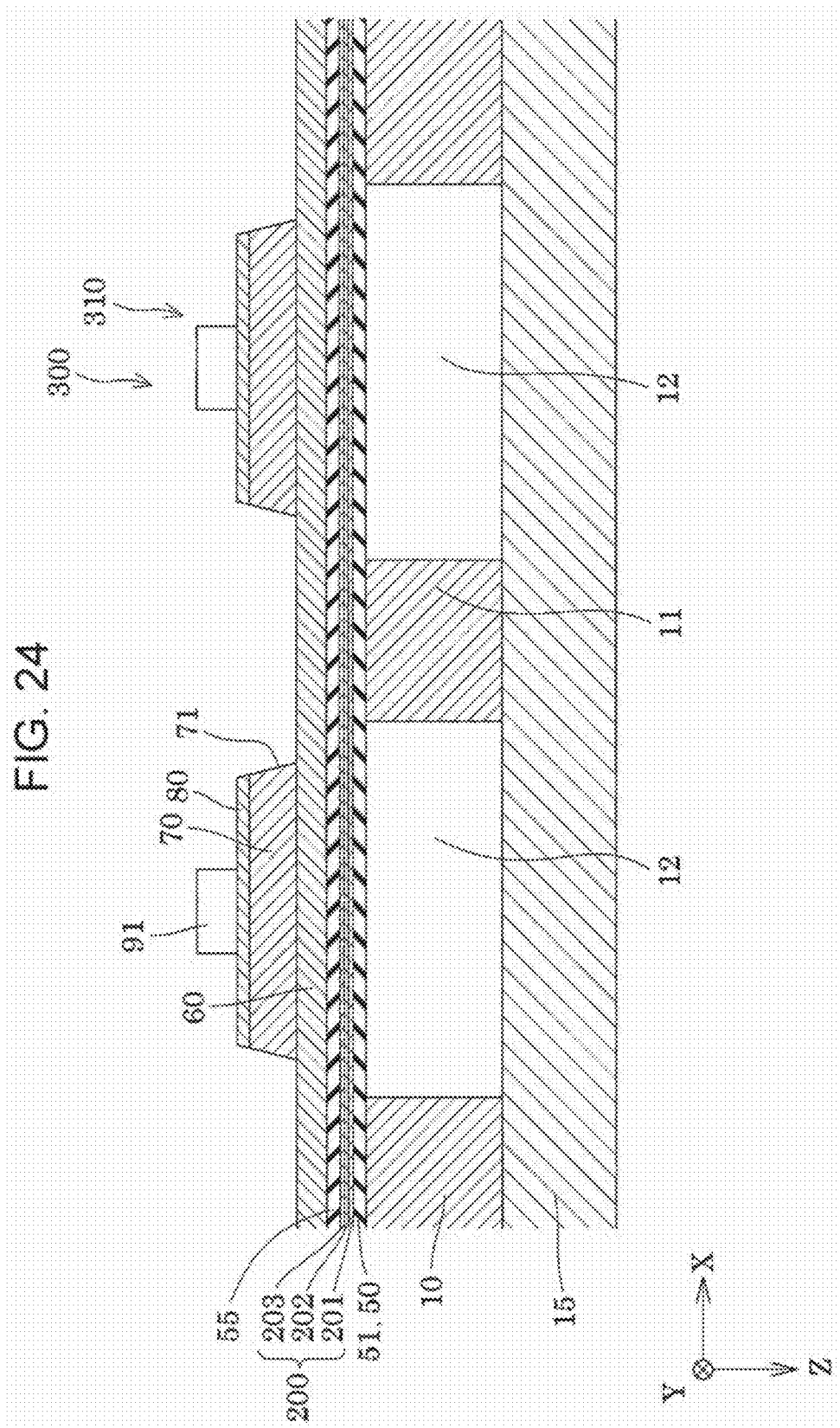
FIG. 24 is a cross-sectional diagram illustrating a variation of a piezoelectric actuator.

For example, in Embodiment 1, the first electrode 60 is a set of separate electrodes each of which independently serves for one active portion 310, and the second electrode 80 is a common electrode shared by multiple active portions 310. This, however, is not the only possible electrode configuration. A configuration in which the first electrode 60 is a common electrode with the second electrode 80 being a set of separate electrodes is illustrated in FIGS. 23 and 24. FIG. 23 is a cross-sectional diagram based on line XXIII-XXIII in FIG. 2, illustrating a variation of a piezoelectric actuator and providing an enlarged view of its essential components. FIG. 24 is a cross-sectional diagram based on line XXIV-XXIV in FIG. 2, illustrating a variation of a piezoelectric actuator and providing an enlarged view of its essential components.

As illustrated in FIGS. 23 and 24, the first electrode 60 is narrower in width, in the +Y direction, than the pressure chambers 12 and is continuous in the +X direction. This first electrode 60 provides a common electrode shared by multiple active portions 310.

The piezoelectric layer 70 and the second electrode 80 are divided for separate pressure chambers 12. The second electrode 80 is also divided for separate active portions 310, providing separate electrodes for the active portions 310. Even in such a configuration, the piezoelectric layer 70 is (100) preferentially oriented as in Embodiment 1. The orientation layer 200 provided between the elastic film 51 serving as the diaphragm 50 and the piezoelectric layer 70 is multi-tiered, formed by first, second, and third tiers 201, 202, and 203 in this embodiment, and, by virtue of this, the uppermost third tier 203 of the orientation layer 200 achieves a preferred orientation with limited influence of the underlying diaphragm 50. On or above this orientation layer 200, the piezoelectric layer 70 is orientationally controlled.

The orientation layer 200 in Embodiment 1 is between the diaphragm 50 and the insulating film 55, but the orientation layer 200 can be elsewhere between the diaphragm 50 and the piezoelectric layer 70. For example, the orientation layer 200 may be between the insulating film 55 and the first electrode 60 or may be between the first electrode 60 and the piezoelectric layer 70. Wherever the orientation layer 200 is, the lowermost tier of this stack of two or more tiers functions as a sacrificial layer that limits the influence of the underlying layer or film, and the uppermost tier achieves a preferred orientation through self-assembly. On or above this orientation layer 200, the piezoelectric layer 70 is orientationally controlled. The piezoelectric layer 70 achieves a preferred orientation in consequence.

The insulating film 55, used in Embodiment 1, is optional; the insulating film 55 may be omitted.

Figure 25:
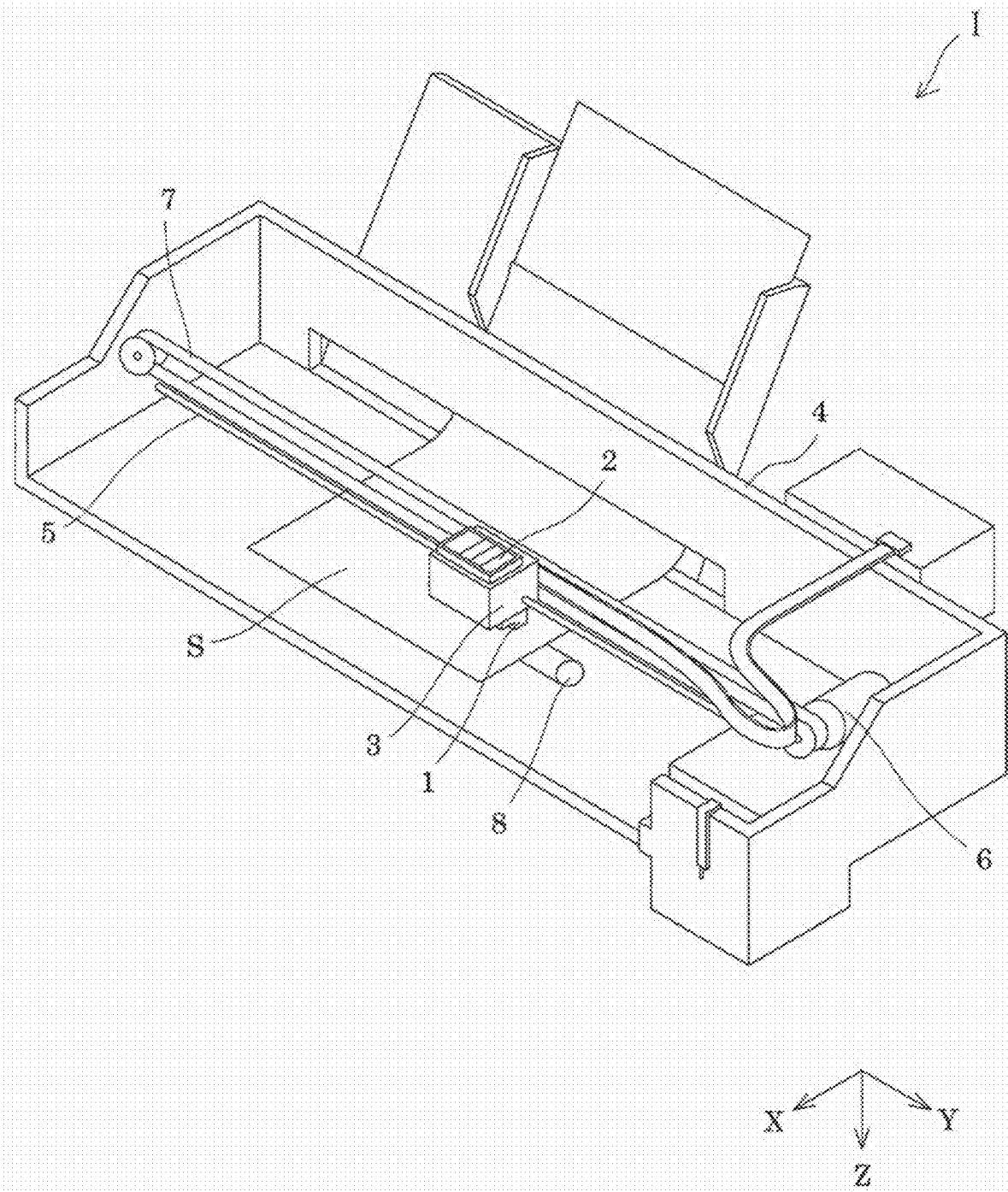
FIG. 25 is a diagram illustrating a schematic structure of a recording apparatus according to an embodiment.

The recording heads 1 according to these embodiments are for use with an ink jet recording apparatus, an example of a liquid ejecting apparatus. FIG. 25 is a schematic diagram illustrating an example of an ink jet recording apparatus, an example of a liquid ejecting apparatus, according to an embodiment.

The recording head 1 in the ink jet recording apparatus I illustrated in FIG. 25 is on a carriage 3 together with detachable cartridges 2, which constitute an ink supply mechanism. This carriage 3 with the recording head 1 thereon can move freely in the direction of the axis of a carriage shaft 5 attached to the body 4.

The power of a motor 6 is transmitted to the carriage 3 through cogwheels (not illustrated) and a timing belt 7, causing the carriage 3 with the recording head 1 thereon to move along the carriage shaft 5. The recording apparatus I also has a transport roller 8 as a transport mechanism inside the body 4, and a recording sheet S, which is a sheet of paper or other recording medium, is transported by the transport roller 8. The mechanism for transporting the recording sheet S does not need to be a transport roller; a belt or drum, for example, may also be used.

Configured as such, the ink jet recording apparatus I ejects ink droplets from the recording head 1 while transporting the recording sheet S in the +X direction to change its position relative to the recording head 1 and moving the carriage 3 back and forth in the Y direction to change its position relative to the recording sheet S. As a result, the ink droplets are attached to substantially the entire surface of the recording sheet S, or "printing" is carried out.

It should be noted that this ink jet recording apparatus I has a recording head 1 on a carriage 3 that moves back and forth in the Y direction, which is the main scanning direction, but this is not the only possible configuration. For example, an aspect of the present disclosure can also be applied to a so-called "line" recording apparatus, which has a stationary recording head 1 and carries out printing simply by moving a recording sheet S, such as a sheet of paper, in the X direction, which is the sub-scanning direction.

Although this embodiment describes an ink jet recording head as an example of a liquid ejecting head and an ink jet recording apparatus as an example of a liquid ejecting apparatus, aspects of the present disclosure are intended for liquid ejecting heads and liquid ejecting apparatuses in general. Naturally, the present disclosure can be applied to heads and apparatuses that eject a non-ink liquid. Examples of such liquid ejecting heads include recording heads for printers or other image recording apparatuses, colorant ejecting heads for the production of color filters, for example in liquid crystal displays, electrode material ejecting heads for the formation of electrodes in organic EL displays, FEDs (field-emission displays), etc., and bio-organic substance ejecting heads for the production of biochips. The present disclosure can also be applied to liquid ejecting apparatuses having such a liquid ejecting head.

The applicability of aspects of the present disclosure, furthermore, is not limited to ink jet recording and other liquid ejecting heads. The present disclosure can also be applied to piezoelectric devices, such as ultrasonic devices, motors, pressure sensors, pyroelectric elements, and ferroelectric elements. The piezoelectric devices also include finished articles made with such piezoelectric devices, such as apparatuses that eject liquid or other materials made with a head that ejects liquid or other material; ultrasonic sensors, which are made with ultrasonic elements; robots powered by a motor; IR sensors made with pyroelectric elements; and ferroelectric memories, which are made with ferroelectric elements.

What is claimed is:

1. A piezoelectric device comprising:
   a diaphragm;
   a piezoelectric actuator having a first electrode, a piezoelectric layer, and a second electrode, the first electrode, the piezoelectric layer, and the second electrode being on the diaphragm; and
   a layer containing zirconium oxide between an orientation layer and the first electrode;
   wherein the orientation layer is sandwiched between the diaphragm and the layer containing zirconium oxide, the orientation layer being a stack of two or more tiers.

2. The piezoelectric device according to claim 1, wherein the orientation layer is a stack of tiers containing the same material.

3. The piezoelectric device according to claim 1, wherein the diaphragm contains silicon oxide.

4. The piezoelectric device according to claim 1, wherein the orientation layer contains at least one selected from oxides containing La and Ni, oxides containing Sr and Ru, oxides containing Ba, Sr, and Ti, and oxides containing Bi, Fe, and Ti.

5. The piezoelectric device according to claim 4, wherein the orientation layer is made of oxides containing La and Ni.

6. The piezoelectric device according to claim 1, wherein the orientation layer has a (100) preferentially oriented tier on a piezoelectric layer side.

7. The piezoelectric device according to claim 1, wherein the orientation layer is a stack of three or more tiers.

8. The piezoelectric device according to claim 1, wherein each tier of the orientation layer has a thickness of 10 nm or less.

9. A liquid ejecting head comprising:
   a substrate having a recess;
   a diaphragm on a first side of the substrate;

a piezoelectric actuator having a first electrode, a piezoelectric layer, and a second electrode, the first electrode being on the diaphragm; and a layer containing zirconium oxide between an orientation control layer and the first electrode; and wherein the orientation layer is sandwiched between the diaphragm and the layer containing zirconium oxide, the orientation layer being a stack of two or more tiers.

10. A liquid ejecting apparatus comprising
the liquid ejecting head according to claim 9.

11. A method for producing a piezoelectric device including:

a diaphragm;

a piezoelectric actuator having a first electrode, a piezoelectric layer, and a second electrode, the first electrode being on the diaphragm; and a layer containing zirconium oxide between an orientation control layer and the first electrode, wherein the orientation layer is sandwiched between the diaphragm and the layer containing zirconium oxide, the orientation layer being a stack of two or more tiers, the method comprising forming each tier of the orientation layer by a liquid phase method.

12. The method according to claim 11 for producing a piezoelectric device, wherein the orientation layer is formed by stacking tiers containing the same material.

13. The method according to claim 11 for producing a piezoelectric device, wherein the diaphragm contains silicon oxide.

14. The method according to claim 11 for producing a piezoelectric device, wherein the orientation layer contains at least one selected from oxides containing La and Ni, oxides containing Sr and Ru, oxides containing Ba, Sr, and Ti, and oxides containing Bi, Fe, ad Ti.

15. The method according to claim 14 for producing a piezoelectric device, wherein the orientation layer is made of oxides containing La and Ni.

16. The method according to claim 11 for producing a piezoelectric device, wherein the orientation layer has a (100) preferentially oriented tier on a piezoelectric layer side.

17. The method according to claim 11 for producing a piezoelectric device, wherein the orientation layer is formed by stacking three or more tiers.

18. The method according to claim 11 for producing a piezoelectric device, wherein each tier of the orientation layer is formed to a thickness of 10 nm or less.

* * * * *